(12) United States Patent
Chu et al.

(10) Patent No.: US 11,816,579 B2
(45) Date of Patent: Nov. 14, 2023

(54) METHOD AND APPARATUS FOR DETECTING DEFECT PATTERN ON WAFER BASED ON UNSUPERVISED LEARNING

(71) Applicant: SAMSUNG SDS CO., LTD., Seoul (KR)

(72) Inventors: Min Sik Chu, Seoul (KR); Seong Mi Park, Seoul (KR); Jiin Jeong, Seoul (KR); Jae Hoon Kim, Seoul (KR); Kyong Hee Joo, Seoul (KR); Ho Geun Park, Seoul (KR); Baek Young Lee, Seoul (KR)

(73) Assignee: SAMSUNG SDS CO., LTD., Seoul (KR)

( * ) Notice: Subject to any disclaimer, the term of this patent is extended or adjusted under 35 U.S.C. 154(b) by 0 days.

(21) Appl. No.: 18/097,608

(22) Filed: Jan. 17, 2023

(65) Prior Publication Data

US 2023/0177347 A1    Jun. 8, 2023

Related U.S. Application Data

(62) Division of application No. 16/884,587, filed on May 27, 2020, now Pat. No. 11,587,222.

(30) Foreign Application Priority Data

May 29, 2019    (KR) .................. 10-2019-0063195

(51) Int. Cl.
*G06K 9/00* (2022.01)
*G06N 3/088* (2023.01)
(Continued)

(52) U.S. Cl.
CPC ............. *G06N 3/088* (2013.01); *G06F 18/23* (2023.01); *G06N 3/045* (2023.01); *G06N 3/047* (2023.01);
(Continued)

(58) Field of Classification Search
CPC ........ G06N 3/088; G06N 3/045; G06N 3/047; G06F 18/23; G06T 7/001; G06T 2207/20081; G06T 2207/20084; G06T 2207/30148; G06V 10/30; G06V 10/431; G06V 10/48; G06V 10/7625; G06V 10/7715
See application file for complete search history.

(56) References Cited

U.S. PATENT DOCUMENTS 11,587,222 B2 *    2/2023    Chu ...................... G03F 7/705

* cited by examiner

*Primary Examiner* — Samir A Ahmed
(74) *Attorney, Agent, or Firm* — Sughrue Mion, PLLC

(57) ABSTRACT

A method for clustering based on unsupervised learning according to an embodiment of the invention enables clustering for newly generated patterns and is robust against noise, and does not require tagging for training data. According to one or more embodiments, noise is accurately removed using three-dimensional stacked spatial auto-correlation, and multivariate spatial probability distribution values and polar coordinate system spatial probability distribution values are used as learning features for clustering model generation, making them robust to noise, rotation, and fine unusual shapes. In addition, clusters resulting from clustering are classified into multi-level clusters, and stochastic automatic evaluation of normal/defect clusters is possible only with measurement data without a label.

7 Claims, 23 Drawing Sheets

(51) Int. Cl.
  *G06T 7/00*    (2017.01)
  *G06F 18/23*   (2023.01)
  *G06N 3/045*   (2023.01)
  *G06N 3/047*   (2023.01)
  *G06V 10/42*   (2022.01)
  *G06V 10/762*  (2022.01)
  *G06V 10/77*   (2022.01)
  *G06V 10/30*   (2022.01)
  *G06V 10/48*   (2022.01)
(52) U.S. Cl.
  CPC .............. *G06T 7/001* (2013.01); *G06V 10/30* (2022.01); *G06V 10/431* (2022.01); *G06V 10/48* (2022.01); *G06V 10/7625* (2022.01); *G06V 10/7715* (2022.01); *G06T 2207/20081* (2013.01); *G06T 2207/20084* (2013.01); *G06T 2207/30148* (2013.01)

FIG. 18
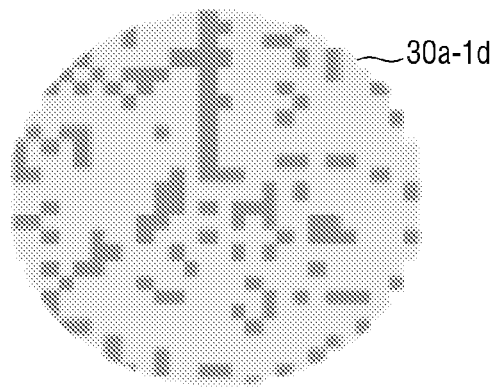
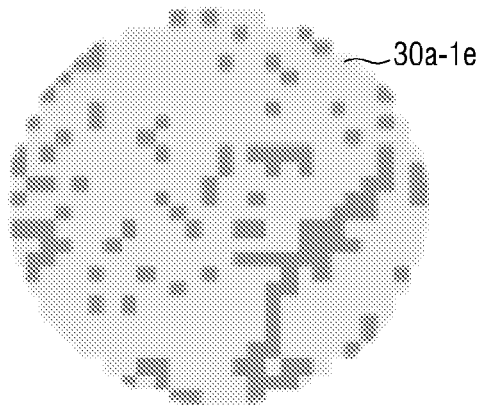
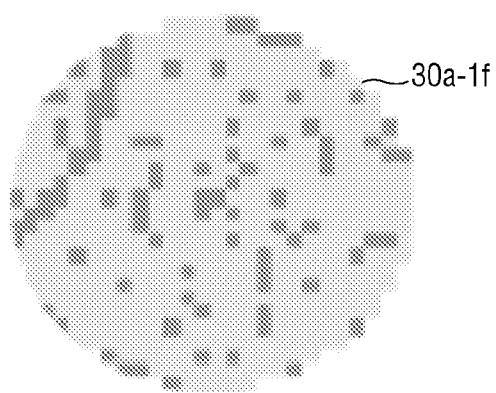
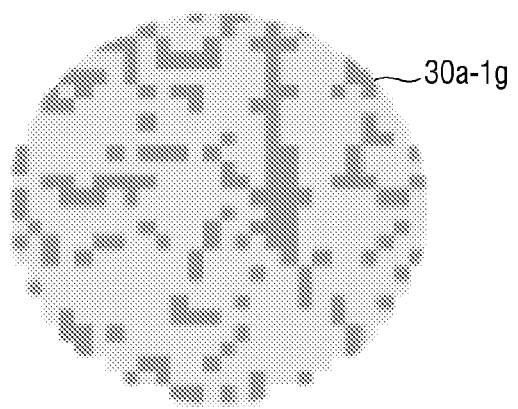

FIG. 21

| Type | Class Name | Portion |
|---|---|---|
| 1.6%<br>32/1992 | Negative Skewed | 1.6% |
| 17.2%<br>343/1992<br><br>Complex Pattern<br><br>(37 Cluster) | 1 | 1.6% |
| | 2 | 0.6% |
| | 3 | 0.4% |
| | 4 | 0.4% |
| | 5 | |
| | ... | 0.6% |
| | 34 | 0.1% |
| | 35 | 0.4% |
| | 36 | 0.8% |
| | 37 | 0.5% |
| 81.2<br>1617/1992<br><br>Simple Pattern<br><br>(4Cluster) | Edge | 40.2% |
| | centerEdge | 27.3% |
| | ... | |
| | DonutEdge | 0.7% |

Portion (a)

| Good(<1) | Normal(1~3) | Bad (3<) |
|---|---|---|
| 100-10=90% | 10*2/3=6.7% | 10*1/3 =3.3% |

(b)  probability of user manipulation (c)

| Good(0.9) | Normal (0.07) | Bad (0.03) |
|---|---|---|
| 0.1 | 0.6 | 0.9 |
| 0.9 | 0.4 | 0.1 |

(d)

| Good(0.9) | Normal (0.07) | Bad(0.03) |
|---|---|---|
| 0.1 | 0.6 | 0.9 |

$P(CLK|G)*P(G) = 0.09*0.1 = 0.09$
$P(CLK|N)*P(NG) = 0.07*0.6 = 0.042$
$P(CLK|B)*P(B) = 0.03*0.9 = 0.027$ (e)
$P(CLK|G)*P(G) / P(CLK|G)*P(G) + P(CLK|B)*P(B) + P(CLK|N)*P(NG) = 0.09/(0.09+0.042+0.027 = 0.566$
$P(CLK|B)*P(B) / P(CLK|G)*P(G) + P(CLK|B)*P(B) + P(CLK|N)*P(NG) = 0.042/(0.09+0.042+0.027 = 0.264$
$P(CLK|N)*P(NG) / P(CLK|G)*P(G) + P(CLK|B)*P(B) + P(CLK|N)*P(NG) = 0.027/(0.09+0.042+0.027 = 0.170$

METHOD AND APPARATUS FOR DETECTING DEFECT PATTERN ON WAFER BASED ON UNSUPERVISED LEARNING

CROSS REFERENCE TO RELATED APPLICATIONS AND CLAIM OF PRIORITY

The present application is a divisional application of U.S. patent application Ser. No. 16/884,587, filed May 27, 2020, which claims priority to the benefit of Korean Patent Application No. 10-2019-0063195, filed on May 29, 2019, in the Korean Intellectual Property Office, the disclosure of which is incorporated herein by reference in its entirety.

BACKGROUND

1. Field

The present inventive concept relates to a method and apparatus for detecting a defect pattern on a wafer based on unsupervised learning. More specifically, it relates to a method and apparatus for effectively removing noise included in a measurement of a wafer and effectively clustering a defect pattern on a wafer through unsupervised learning of the measurement of the wafer from which the noise is removed.

2. Description of the Related Art

Machine learning-based techniques for identifying product error patterns or defective patterns that may lead to reduced manufacturing competitiveness, such as reduced yield, are provided. As an example, supervised learning-based techniques for training a pattern recognition model using training data tagged with a defective pattern are provided. Among the supervised learning-based techniques, a technique for training a pattern recognition model including a neural network architecture including a convolutional neural network (CNN) using training data in the form of an image in which a defective pattern is tagged is provided.

However, the pattern recognition model trained with the supervised learning-based techniques may only recognize known patterns and has a fundamental problem that it is not possible to recognize newly generated error patterns because they have not been trained.

In addition, in a method for recognizing a defective pattern by learning an image of a product, noise of a large intensity included in the image is blurred and erases surrounding patterns, or the noise is trained as a main component, which has a problem of inhibiting the accuracy of pattern recognition.

SUMMARY

Aspects of the inventive concept provide a method for clustering a defective pattern based on unsupervised learning, which may be performed without preceding pattern tagging on training data, and an apparatus in which the method is implemented.

Aspects of the inventive concept also provide a method for performing clustering of a defective pattern in consideration of defect-related risk of the wafer based on distribution of measurements of the wafer, and an apparatus in which the method is implemented.

Aspects of the inventive concept also provide a method for clustering a defective pattern that is robust to different wafer inspection data as an orientation of a wafer is changed in consideration of a shape of the wafer, and an apparatus in which the method is implemented.

Aspects of the inventive concept also provide a method for clustering a defective pattern that may prevent grouping of a defective chip distribution of a wafer from being impaired due to noise, and an apparatus in which the method is implemented.

Aspects of the inventive concept also provide a method capable of clustering even for a newly emerged defective pattern, and an apparatus in which the method is implemented.

Aspects of the inventive concept also provide a method for clustering, which provides results of scoring or grade classification for each cluster as well as clustering, and an apparatus in which the method is implemented.

Aspects of the inventive concept also provide a method for clustering, which provides scoring or ranking results for each cluster as well as clustering, in which the results of scoring or grade classification for each cluster are updated in conjunction with a user manipulation related to information inquiry for each cluster, and an apparatus in which the method is implemented.

Aspects of the inventive concept also provide a method for clustering that provides automatic labeling for at least a portion of each cluster depending on a result of clustering by referring to external cluster data that has been labeled as well as clustering, and an apparatus in which the method is implemented.

Aspects of the inventive concept also provide a method for cyclic defective pattern clustering in which results of scoring or grade classification for each cluster recognized as a result of clustering are reflected in defect/good quality determination through binarization of measures, and the bad/good quality determination again affects the result of clustering, and an apparatus in which the method is implemented.

Aspects of the inventive concept also provide a method for clustering a defective pattern, which is robust to noise, and an apparatus in which the method is implemented.

Aspects of the inventive concept also provide a method for removing noise in two-dimensional data, which is robust to spike-like noise with weak auto-correlation with adjacent values, and an apparatus in which the method is implemented.

Aspects of the inventive concept also provide a new method to recognize a scratch type defective pattern with high accuracy, and an apparatus in which the method is implemented.

Aspects of the inventive concept also provide a new method to recognize a shot type defective pattern with high accuracy, and an apparatus in which the method is implemented.

Aspects of the inventive concept also provide a method for removing noise in two-dimensional data, which is robust to spike-like noise with weak auto-correlation with adjacent values, and an apparatus in which the method is implemented.

According to the inventive concept, a method for processing data performed by a computing device is provided. The method includes obtaining original data including a plurality of values having a first axis coordinate and a second axis coordinate, mapping the original data to a three-dimensional space composed of the first axis, the second axis, and a third axis, wherein a third axis coordinate corresponds to the value, and performing first noise removal based on three-dimensional spatial auto-correlation on the original data mapped to the three-dimensional space.

According to the inventive concept, a method for detecting a defect pattern on a wafer performed by a computing device is provided. The method includes obtaining binarized wafer inspection data including data indicating defectiveness of each of a plurality of chips on the wafer, imaging the binarized inspection data, performing shape detection transformation for detecting a line formed in an image of the wafer inspection data, and determining the wafer inspection data as a scratch type defect pattern based on determining that the line is formed in the image of the wafer inspection data as a result of performing the shape detection transformation.

According to the inventive concept, a method for detecting a defect pattern on a wafer performed by a computing device is provided. The method includes obtaining binarized wafer inspection data including data indicating defectiveness of each of a plurality of chips on the wafer, transforming an image of the binarized wafer inspection data into a frequency domain, and determining the wafer inspection data as a shot type defect pattern based on a signal strength of one or more predetermined frequencies exceeding a reference value as a result of performing the shape detection transformation.

According to the inventive concept, a method for detecting a pattern performed by a computing device is provided. The method includes obtaining inspection data for each object including a plurality of measurements having a first axis coordinate and a second axis coordinate, extracting a feature from the inspection data, wherein the feature includes a first feature calculated based on a measurement distribution pattern obtained as a result of density estimation for the measurement, and performing unsupervised learning for generating a defect pattern clustering model using the feature of the inspection data.

According to the inventive concept, a method for detecting a defect pattern on a wafer performed by a computing device is provided. The method includes obtaining binarized inspection data for each wafer including data indicating defectiveness of each of a plurality of chips having a first axis coordinate and a second axis coordinate, extracting a feature from the binarized inspection data, wherein the feature includes a feature calculated based on a defective chip distribution pattern obtained as a result of density estimation based on a polar coordinate system of a defective chip, and performing unsupervised learning for generating a defect pattern clustering model using the feature of the binarized inspection data.

According to the inventive concept, a method for detecting a defect pattern on a wafer performed by a computing device is provided. The method includes obtaining binarized inspection data for each wafer including data indicating defectiveness of each of a plurality of chips formed on the wafer, calculating a defective chip density in a quadrat for each quadrat formed on a plane on the wafer, wherein each quadrat is partitioned to include a plurality of chips, extracting a feature for the binarized inspection data, wherein the feature includes a feature calculated based on the defective chip density for each quadrat, and performing unsupervised learning for generating a defect pattern clustering model using the feature of the binarized inspection data.

21

According to the inventive concept, a method for detecting a defect pattern on a wafer performed by a computing device is provided. The method includes obtaining wafer inspection data including measurements for each of a plurality of chip included in the wafer, wherein the wafer inspection data includes a first axis coordinate and a second axis coordinate for each chip, mapping the original data to a three-dimensional space composed of the first axis, the second axis, and a third axis, wherein a third axis coordinate corresponds to the measurement, performing first noise removal based on three-dimensional spatial auto-correlation on the original data mapped to the three-dimensional spatial, obtaining a first feature based on a measurement distribution pattern obtained as a result of density estimation for the measurement after performing the first noise removal, performing binarization on the measurements remained as a result of performing the first noise removal to determine defectiveness of each chip, performing, after performing the binarization, second noise removal on a plane composed of the first axis and the second axis, through density-based clustering, on points indicating defective chips on the plain, obtaining a second feature calculated based on a defective chip distribution pattern obtained as a result of density estimation based on a polar coordinate system for defective chip points remained as a result of performing the second noise removal, and a third feature calculated based on a defective chip density for each quadrat formed on a plane on the wafer, and performing unsupervised learning for generating a defect pattern clustering model using the first feature, the second feature, and the third feature.

Aspects of the present inventive concept are not restricted to those set forth herein. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

These and/or other aspects will become apparent and more readily appreciated from the following description of the embodiments, taken in conjunction with the accompanying drawings in which:

FIG. 18 is images of exemplary wafer defective chips that may be detected according to the process for detecting the scratch type cluster first described with reference to FIG. 17;

FIGS. 21 and 22 are diagrams for explaining in detail a process for post-adjusting a grade for each cluster performed in the method for detecting the defect pattern of the wafer described with reference to FIG. 16.

DETAILED DESCRIPTION

Figure 1:
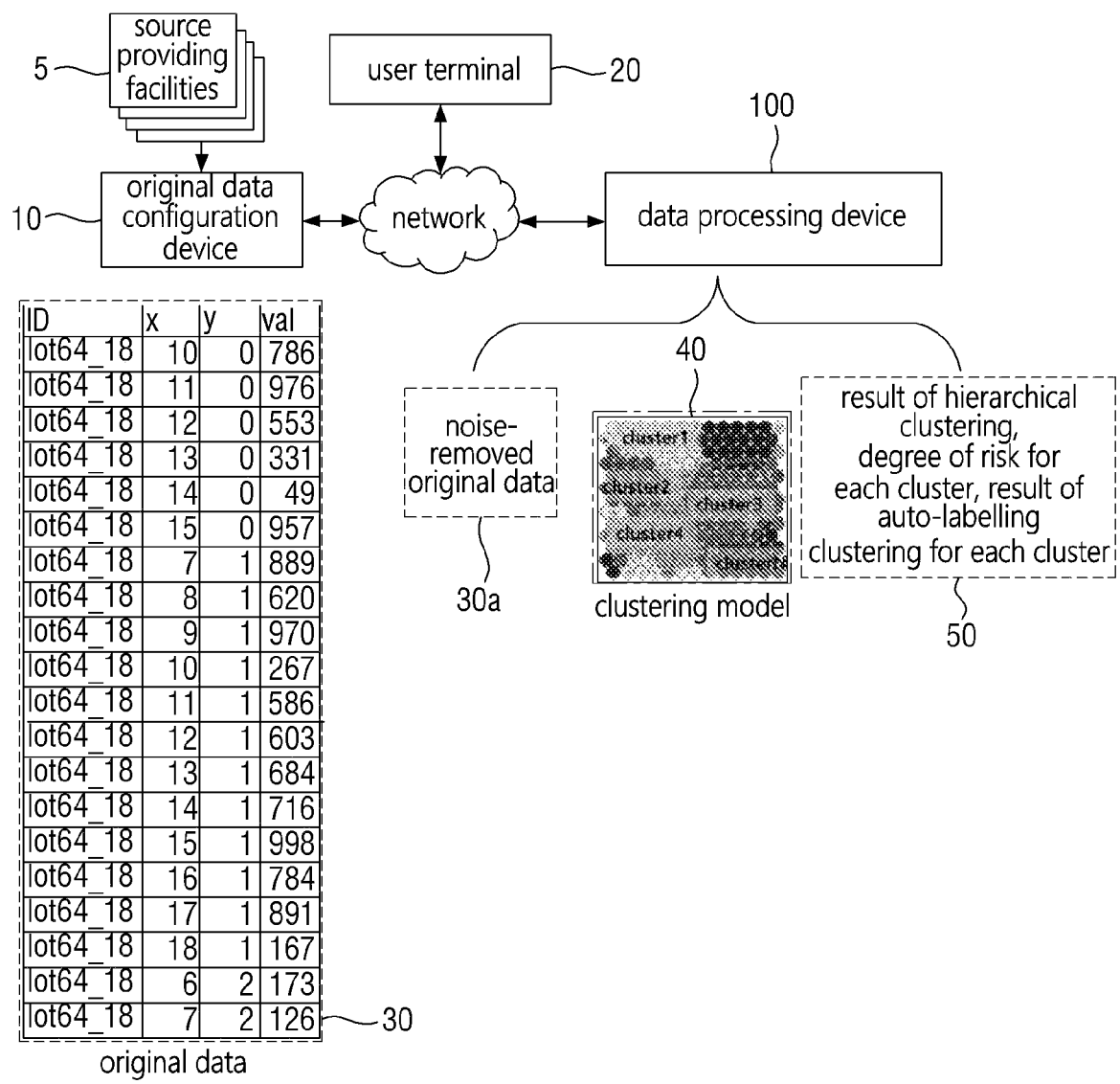
FIG. 1 is a configuration diagram of a system for clustering data according to an embodiment of the present inventive concept.

Hereinafter, preferred embodiments of the present disclosure will be described with reference to the attached drawings. Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims.

In adding reference numerals to the components of each drawing, it should be noted that the same reference numerals are assigned to the same components as much as possible even though they are shown in different drawings. In addition, in describing the present invention, when it is determined that the detailed description of the related well-known configuration or function may obscure the gist of the present invention, the detailed description thereof will be omitted.

Unless otherwise defined, all terms used in the present specification (including technical and scientific terms) may be used in a sense that can be commonly understood by those skilled in the art. In addition, the terms defined in the commonly used dictionaries are not ideally or excessively interpreted unless they are specifically defined clearly. The terminology used herein is for the purpose of describing particular embodiments only and is not intended to be limiting of the invention. In this specification, the singular also includes the plural unless specifically stated otherwise in the phrase.

In addition, in describing the component of this invention, terms, such as first, second, A, B, (a), (b), can be used. These terms are only for distinguishing the components from other components, and the nature or order of the components is not limited by the terms. If a component is described as being "connected," "coupled" or "contacted" to another component, that component may be directly connected to or contacted with that other component, but it should be understood that another component also may be "connected," "coupled" or "contacted" between each component.

Hereinafter, some embodiments of the present invention will be described in detail with reference to the accompanying drawings.

Figure 2:
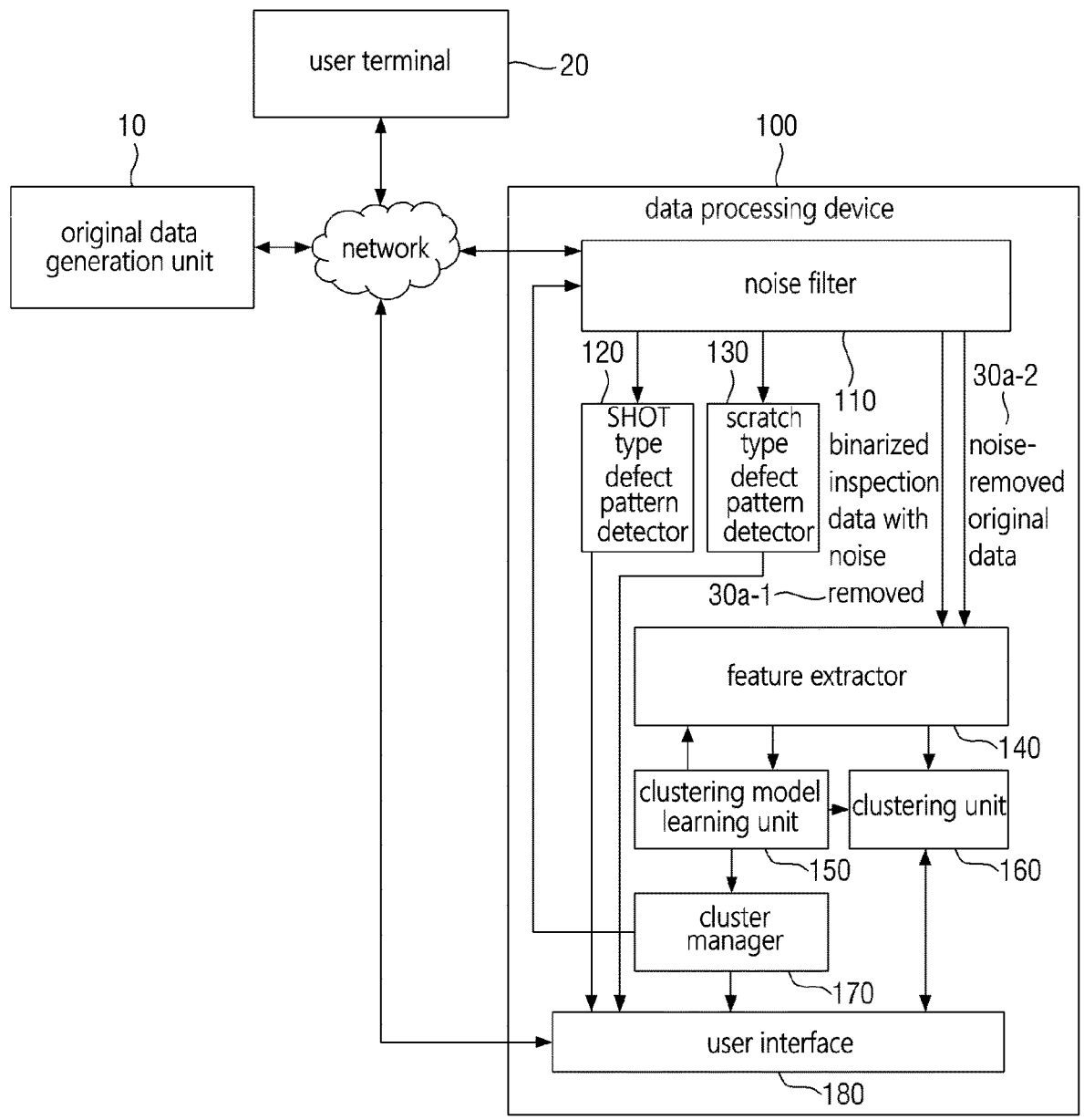
FIG. 2 is a detailed configuration diagram of the system for clustering the data described with reference to FIG. 1.

Referring to FIGS. 1 and 2, the configuration and operation of a system for clustering data according to an embodiment of the present inventive concept will be described.

The system for clustering the data according to the present embodiment may be configured to include an original data configuration device 10 and a data processing device 100 connected to a network. The original data configuration device 10 configures a plurality of original data 30 to be clustered. Periodically or in response to the original data 30 being configured, the original data configuration device 10 may transmit one or more original data 30 to the data processing device 100. When the plurality of original data 30 are gathered to satisfy a clustering model generation condition or an update condition, the data processing device 100 performs a logic for generating or updating a clustering model.

The original data configuration device 10 may configure the original data 30 by collecting and processing data received from one or more source providing facilities 5. Since the data processing device 100 will attempt to cluster the plurality of original data received from the original data configuration device10, it is preferable that the original data configuration device 10 transmits only the same type of original data 30 to the data processing device 100. For example, the original data configuration device 10 should bundle only inspection data of a semiconductor wafer and transmit it to the data processing device 100, and should not bundle the inspection data of the semiconductor wafer and inspection data of a display panel together and transmit it to the data processing device 100.

The source providing facilities 5 may be, for example, various devices for continuously generating data such as each facility in a production line, inspection equipment for each process, inspection equipment for a finished product, a sensor, an IoT device, or the like.

The original data 30 may be two-dimensional data. In other words, each value within the data may correspond to a first axis coordinate and a second axis coordinate. The original data 30 may include values corresponding to all coordinates. Alternatively, the original data 30 may only include data associated with coordinates where corresponding value exists, such as the original data 30 shown in FIG. 1. It is preferable that the value within the original data 30 is a numerical value. However, even if the value is not a numerical value, the data processing device 100 may quantify the value as pre-processing.

When the original data 30 is accumulated sufficiently to perform the logic for generating or updating the clustering model, the data processing device 100 removes noises of the original data 30 and performs unsupervised learning for generating a clustering model 40 using the original data from which the noise has been removed. Since the type of machine learning performed by the data processing device 100 to generate the clustering model 40 is pure unsupervised learning, no tag information or labeling information for the original data 30 is required in the generation of the clustering model. Nevertheless, the clustering model 40 generated by the data processing device 100 enables accurate clustering for two-dimensional data.

In addition, a clustering result 50 that may be provided by the data processing device 100 is also provided with an evaluation result for each cluster, a hierarchical structure of each cluster, and an automatic labeling function for the cluster, in which an evaluation result for each cluster is post-updated to reflect a clustering result inquiry-related manipulation of a user. In this regard, it will be described later in detail together with some embodiments of the present inventive concept.

FIG. 2 shows a detailed configuration for each functional unit of the data processing device 100. Hereinafter, the configuration and operation of the data processing device 100 will be described with reference to FIG. 2. Since each functional unit of the data processing device 100 shown in FIG. 2 will be described in detail later with separate drawings, here, a brief description is made so that only the rough operation of the data processing device 100 may be understood. However, naturally detailed descriptions of some embodiments to be described below may be referred to in understanding the configuration and operation of the data processing device 100 of FIG. 2.

A noise filter 110 performs noise filtering on the original data received from the original data generation unit 10 or previously stored through another path. The noise filter 110 transforms the original data, which is a two-dimensional data, into three-dimensional data by adding a third axis and setting the third axis coordinate as the value of the two-dimensional data. As a result, the original data is transformed into a type of contour data in which the value becomes a height (third axis, z axis) on a plane composed of the first axis (x axis) and the second axis (y axis). This may effectively remove noise or outlier values that spike.

The noise filter 110 performs first noise removal based on three-dimensional spatial auto-correlation on the original data mapped to the three-dimensional space. Wide region noise is removed by the first noise removal. In addition, the noise filter 110 performs binarization on the data remaining after the first noise removal. By the binarization, the original data has a value of either 1 or 0 on a two-dimensional plane. The noise filter 110 performs second noise removal on the original data after the binarizanon through density-based spatial clustering of application with noise (DBSCAN). Local noise that cannot form a group is further removed through the second noise removal. The noise filtering will be described later in more detail with reference to FIGS. 3 to 7.

The data processing device 100 according to the present embodiment effectively clusters the original data including 2-dimensional defect-related measurements. Further, when the measurements have a smaller-the-better characteristic, and the original data includes a measurement obtained as a result of performing an inspection on a product having a symmetrical shape based on a center point such as a circle, an ellipse, or the like, the data processing device 100 effectively clusters the original data. Hereinafter, for convenience of understanding, a description will be given on the assumption that the original data is inspection data of a semiconductor wafer. However, it is noted that the scope of application is not limited to the case where some embodiments of the present inventive concept cluster inspection data of a wafer.

When the original data is inspection data of a wafer, a logic for dedicating to detect a corresponding defect pattern is provided for two known defect patterns present on the wafer. The two known defect patterns are a 'shot type' and a 'scratch type.' A shot type defect pattern detector 120 detects a shot type defect from the original data with high accuracy, and a scratch type defect pattern detector 130 detects a scratch type detect from the original data with high accuracy.

When there are two or more defective patterns on the wafer and the 'shot type' or the 'scratch type' is included, the shot type defect pattern detector 120 and the scratch type defect pattern detector 130, which exist separately from the clustering model, may accurately detect the 'shot type' or the 'scratch type.' Therefore, the data processing device 100 according to the present embodiment may accurately determine, for example, that defects of the 'shot type' and a 'center type' simultaneously exist. Detailed operations of the shot type defect pattern detector 120 and the scratch type defect pattern detector 130 will be described later in more detail with reference to FIGS. 17 to 20.

A feature extractor 140 receives a result of the first noise removal and a result of the second noise removal from the noise filter 110 and extracts features of the original data. The result of the first noise removal is the original data (measurement) 30a-2 from which the wide region noise is removed, and the result of the second noise removal is binarized inspection data 30a-1 from which the local noise as well as the wide region noise are removed and in which each measurement of the original data is binarized.

The feature extracting unit 140 extracts a first feature based on a measurement distribution pattern from the noise-removed original data 30a-2, and extracts a second feature based on a polar coordinate system-based defective chip distribution pattern based on a wafer center point from the binarized inspection data which is noise-removed 30a-1. Further, feature extracting unit 140 obtains a defective chip density in a quadrat for each quadrat formed on a plane on the wafer from the binarized inspection data which is noise-removed 30a-1 and extracts a third feature based on the defective chip density in the quadrat. The second feature includes a 2-1 feature based on a radius-based defective chip distribution pattern based on the wafer center point, and a 2-2 feature based on an angle-based defective chip distribution pattern based on a reference point.

In other words, the feature extractor 140 is capable of extracting four features. However, even if the feature extractor 140 extracts only some of the four features or extracts all of the four features in some embodiments, it may be possible to select only some of the features and provide them to a clustering model learning unit 150.

The feature extractor 140 may adjust a parameter of feature extraction so that a value of a loss function of the clustering model generated by the clustering model learning unit 150 is the smallest. For example, when extracting the third feature, the feature extractor 140 may optimize a first axis resolution and a second axis resolution that define a size of the quadrat so that the value of the loss function is the smallest. The loss function may be a function in which as feature values in clusters are similar, and as the feature values between the clusters are different from each other, the value of the loss function becomes smaller.

The feature extractor 140 will be described later in detail with reference to FIGS. 9 to 10 with respect to the first feature, the second feature, and the third feature.

The clustering model learning unit 150 performs machine learning to generate the clustering model of the original data by using the features of the original data provided from the feature extractor 140, In an embodiment, the machine learning may be unsupervised machine learning. For example, the unsupervised machine learning may use a self-organizing map algorithm. Here, when the input features are several types, the unsupervised machine learning may use a multi-objective self-organizing map algorithm.

The clustering model learning unit 150 provides data indicating a trained clustering model to a clustering unit 160, The data indicating the clustering model may be, for example, data defining the clustering model.

When the clustering model learning unit 150 learns the clustering generation model through the unsupervised machine learning, information on the cluster indicated to by each original data need not be specified. Therefore, when the original data generating device 10 provides the original data to the data processing device 100 in real time according to the configuration of the original data, a system may be built in which the data processing device 100 gathers the original data by a batch size, updates an existing clustering model using the original data gathered by the batch size, and clusters the original data included in a new batch. In this regard, it may be understood that the clustering model learning unit 150 simultaneously serves as a training stage and an inferring stage of the machine learning.

The clustering unit 160 clusters input data using the clustering model trained so far. The clustering unit 160 may perform clustering when clustering of specific original data is requested through a user terminal 20. The specific original data may not be used as training data in a learning process of the clustering model.

The cluster manager 170 generates and updates information on each cluster formed by each original data input as the training data. The information on each cluster may include, for example, a score for each cluster or a grade based thereon, a hierarchical structure for each cluster, a result of automatic labeling for each cluster, and a score for each cluster according to user input for a result of clustering or a result of post-adjustment of a grade based thereon. The operation of the cluster manager 170 will be described in detail later.

For automatic labeling for each cluster, the cluster manager 170 may receive labeling-completed data and automatically label a cluster to which data similar to the labeling-completed data belongs.

When the score for each cluster or the grade based thereon is generated by the cluster manager 170, a numerical value that is a reference is also provided to the noise filter 110. The numerical value may be, for example, a numerical value determined based on the Taguchi methodology according to the smaller-the-better characteristic or a larger-the-better characteristic of the measurement included in the original data. The noise filter 110 may perform the binarization described above based on the numerical value.

A user interface 180 configures a user interface for inquiring the result of the clustering and provides it to the user terminal 20 through a network. The user interface 180 may gather user manipulation records for inquiring the result of the clustering and provide it to the cluster manager 170 so that post-adjustment of the score for each cluster or the grade based thereon may be performed.

In the above, the schematic functional unit of the data processing device 100 has been described. Note that, as already mentioned, it is noted that detailed descriptions of some embodiments to be described below may be referred to in understanding the configuration and operation of the data processing device 100. Next, a method for removing noise according to another embodiment of the present inventive concept will be described with reference to FIGS. 3 to 7.

It may be understood that the method for removing the noise according to the present embodiment is a method that may be performed by the noise filter 110 included in the data processing device 100 of FIG. 2. In other words, it may be understood that it is performed as a pre-process for clustering data. However, the method for removing the noise according to the present embodiment does not have meaning only as the pre-process for clustering the data. It may be performed as a pre-process of various data processing methods that require accurate removal of noise for two-dimensional data. Also, the method for removing the noise according to the present embodiment may be implemented independently.

The method for removing the noise according to the present embodiment may be implemented by a computing device. The computing device may be, for example, a data processing device described with reference to FIGS. 1 to 2. Hereinafter, each operation of the method for removing the noise according to the present embodiment will be described. It should be noted that in the case where there is no mention of the subject of each operation or expressed passively, the subject is the computing device.

Figure 3:
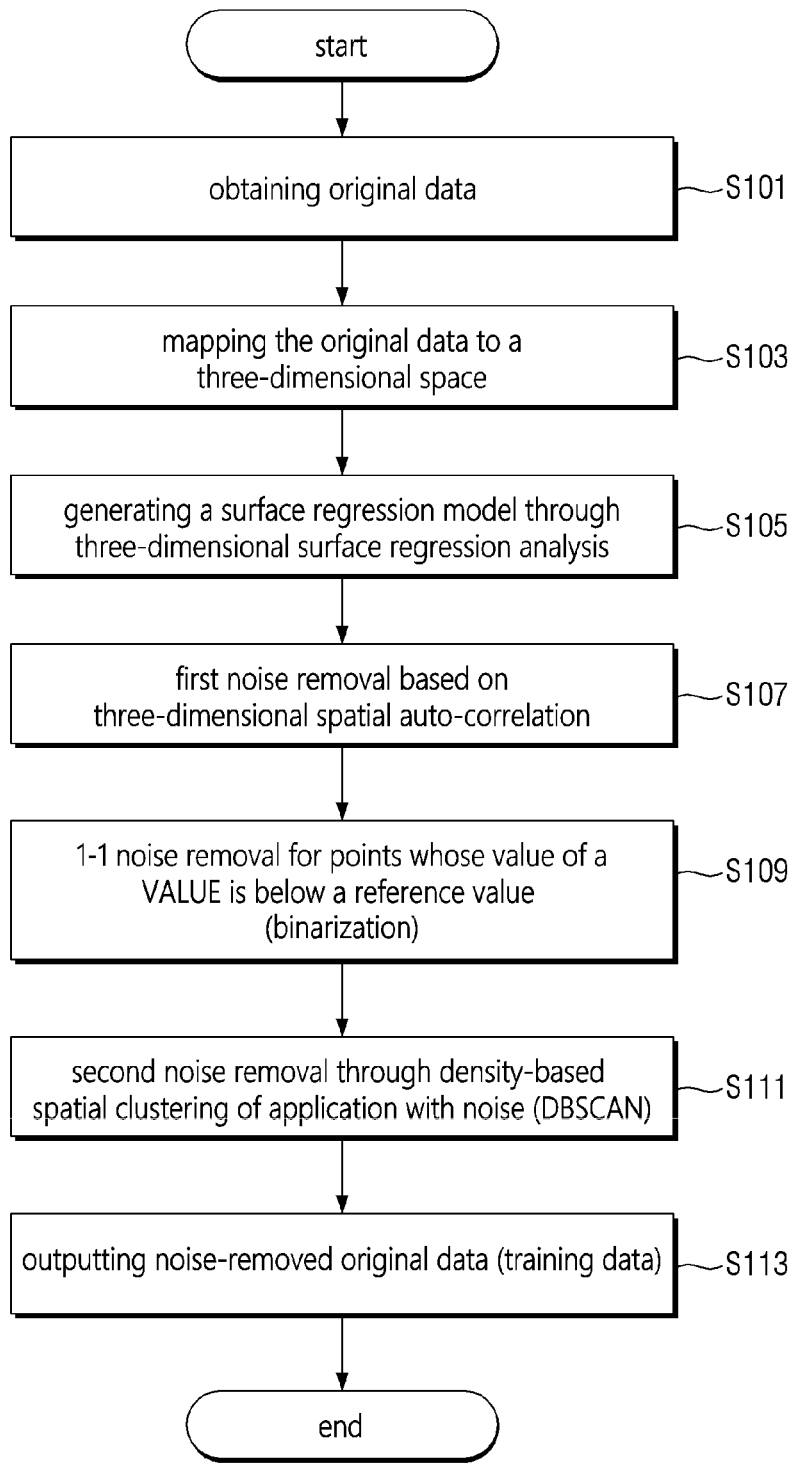
FIG. 3 is a configuration diagram of a method for removing noise according to another embodiment of the present inventive concept.

Hereinafter, the method for removing the noise according to the embodiment will be described with reference mainly to a flowchart of FIG. 3, and with reference to FIGS. 4 to 7.

In step S101, original data is obtained. The original data may be two-dimensional data. A format of the original data is not limited. However, when the original data is not two-dimensional numerical data, but is non-numeric data such as a two-dimensional text or image, a predetermined pre-processing for transforming the non-numerical data into numerical data may be performed. Hereinafter, numerical data included in the original data is referred to as a VALUE for convenience of understanding. For example, the VALUE may be a value measured by inspection equipment when inspecting a finished product or a semi-finished product.

In step S103, the original data is mapped to a three-dimensional space. As already described, the original data may be two-dimensional data. This means that each value has a first axis coordinate and a second axis coordinate. For example, the first axis and the second axis may be perpendicular to each other. The third axis for constructing the three-dimensional space indicates the VALUE. Hereinafter, the third axis may be referred to as a height axis to facilitate understanding.

Figure 4:
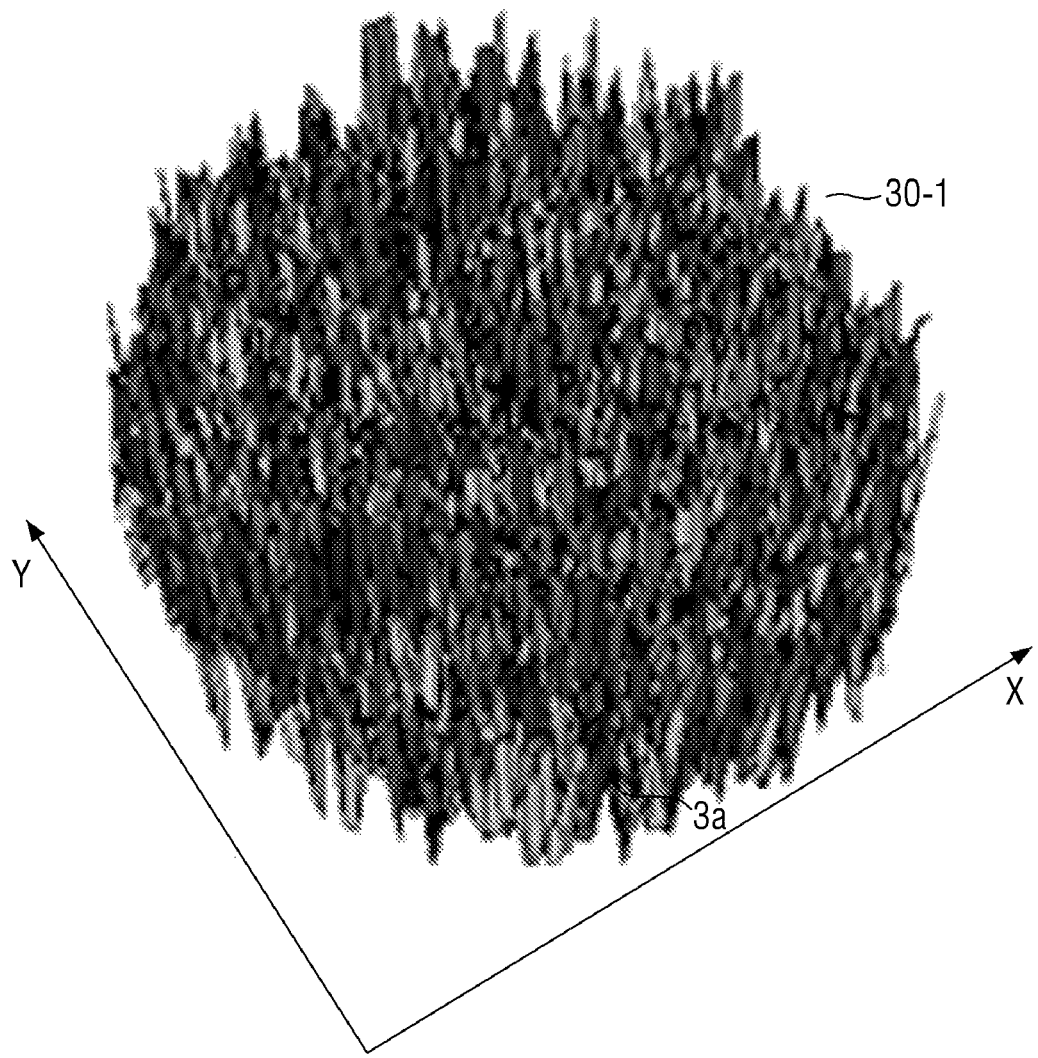
FIG. 4 is a diagram exemplarily showing that two-dimensional data is mapped onto a three-dimensional space for data processing in some embodiments of the present inventive concept.

The numerical data may be data with smaller-the-better characteristic. Here, for a specific position on a plane (composed of the first axis and the second axis) where the VALUE does not exist, a value of the third axis may be initialized to zero. FIG. 4 shows exemplary original data 30-1 mapped to the three-dimensional space. As illustrated in FIG. 4, there is a problem in that it is difficult to identify patterns of the original data due to global noise.

In step S105, a surface regression model is generated through three-dimensional surface regression analysis on the original data mapped to the three-dimensional space. A number of well-known documents may be referred to for the three-dimensional surface regression analysis. A trend of the VALUE on the plane composed of the first axis and the second axis may be expressed through the surface regression model for the original data mapped to the three-dimensional space. This may be understood as a contour line on a map.

In step S107, first noise removal is performed based on three-dimensional spatial auto-correlation for the original data mapped to the three-dimensional space. In the case of the contour line on the map, it is common for heights to be similar in adjacent regions. This was considered in the surface regression model generated in step S105. In step S107, covariance may be calculated using a difference between a height axis (third axis) prediction value of each position on the plane according to the surface regression model and an actual height axis value (i.e., VALUE), and a degree of auto-correlation of each position may be calculated using the covariance. A height axis value of a position on the plane where the degree of auto-correlation is lower than a reference is determined as noise and may be substituted with the height axis prediction value according to the surface regression model.

Figure 5:
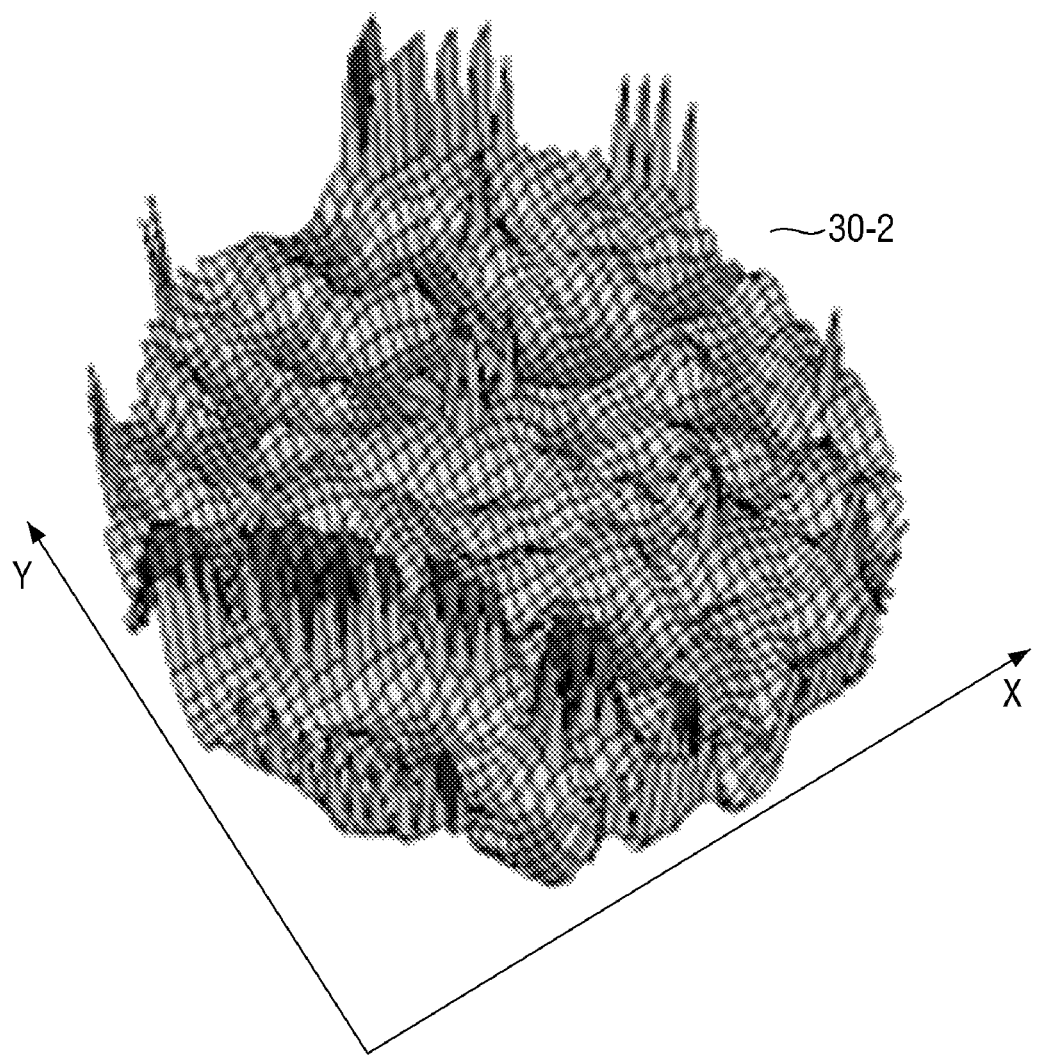
FIG. 5 is a diagram showing a result of first noise removal performed on the data of FIG. 4, according to the method for removing the noise described with reference to FIG. 3.

FIG. 5 shows a result after the first noise removal is performed on the exemplary original data shown in FIG. 4. It may be seen that unlike the original data in FIG. 4, a rough pattern of the original data is identified in the result shown in FIG. 5.

In step S109, binarization is performed on the value of the height axis. In other words, when the value of the height axis at a specific position on the plane composed of the first axis and the second axis is less than a value that is a basis for binarization, 1-1 noise removal is done on the height value of the specific position. Further, when a value of the height axis at another specific position is equal to or higher than the value that is the basis for binarization, the height value at the other specific position is adjusted to 1. As a result, the value of the height axis on the plane composed of the first axis and the second axis will be 1 or 0. This means, in fact, that the original data, which was actually mapped in the three-dimensional space, returns to a two-dimensional plane.

When the VALUE is a value having the smaller-the-better characteristic, each VALUE included in the original data is transformed to normal (0) or abnormal (1) according to the binarization. Naturally, each VALUE after the binarization reflects the result of global noise removal. When each VALUE after the binarization is imaged, a point on the plane composed of the first axis and the second axis may be generated. When the VALUE is a value having the smaller-the-better characteristic, the point may be formed when the VALUE is '1.'

Figure 6:
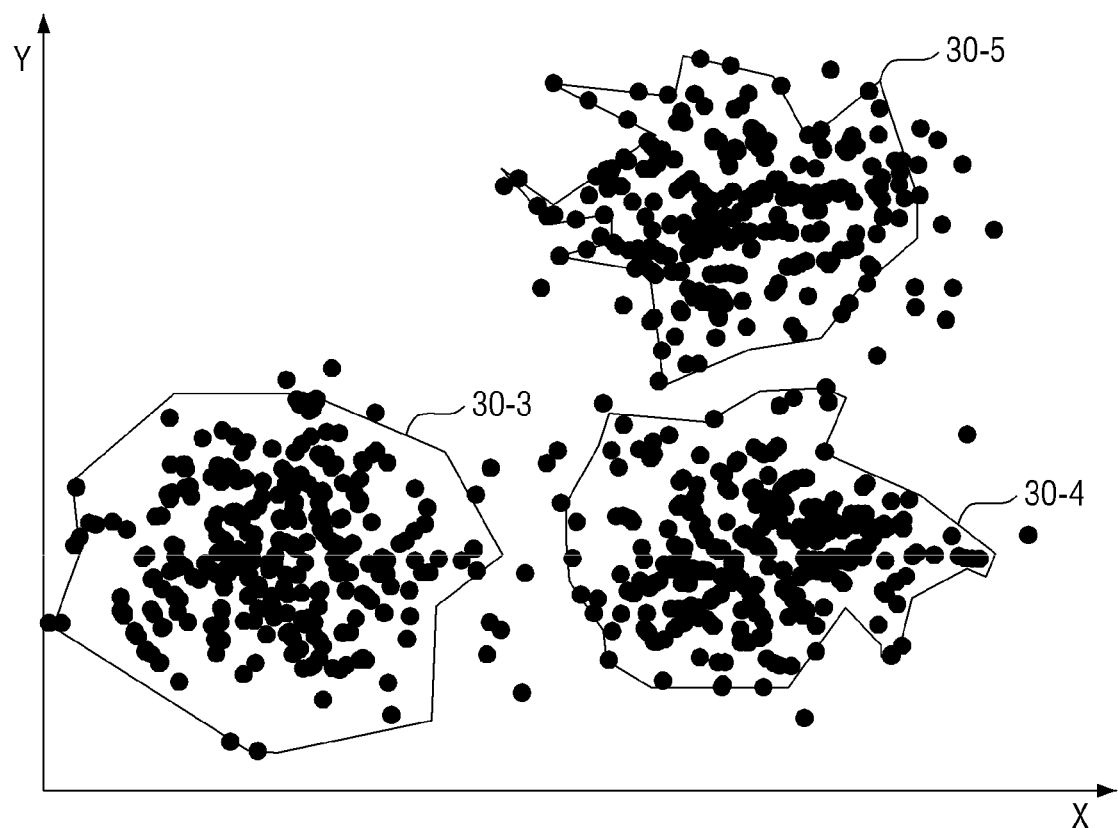
FIG. 6 is a diagram for explaining density-based clustering according to second noise removal performed according to the method for removing the noise described with reference to FIG. 3.

In step S111, second noise removal is performed through density-based spatial clustering of application with noise (DBSCAN). The second noise removal is intended to remove a distant point formed in a weak spot as noise and remove it. In this regard, it may be understood that the second noise removal is local noise removal. As illustrated in FIG. 6, the second noise removal may be performed in step S111 for points that do not belong to clusters 30-3, 30-4, and 30-5 through a density-based clustering logic.

In step S113, the original data from which the noise has been removed is output. At this time, the output original data may be binarized noise-removed original data. The output original data may be data that has recovered original VALUEs at coordinates (on the plane composed of the first axis and the second axis) where VALUES exists after the binarization. Also, in some embodiments, data after the first noise removal in step S107 may be separately output.

Figure 7:
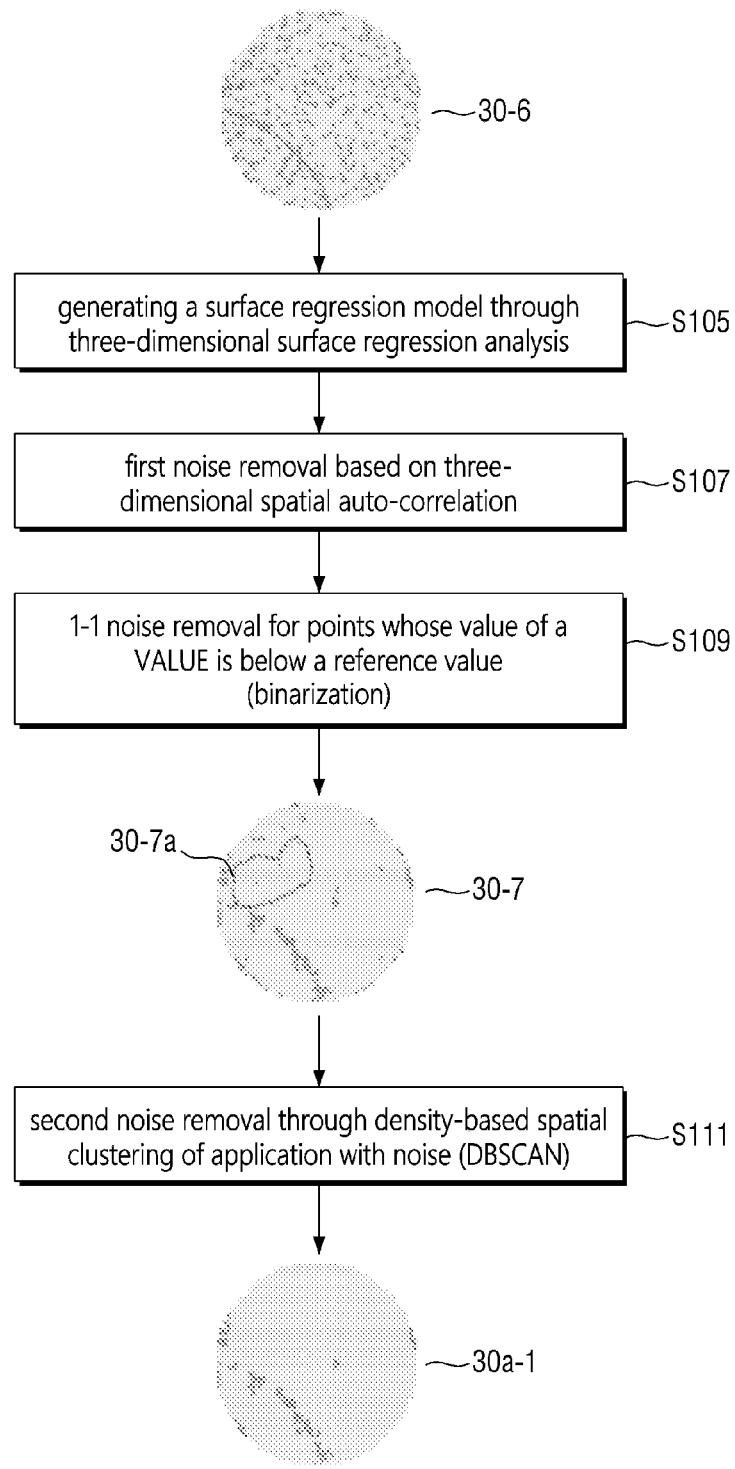
FIG. 7 is a diagram for explaining in detail the method for removing the noise described with reference to FIG. 3 together with an example.
Figure 8:
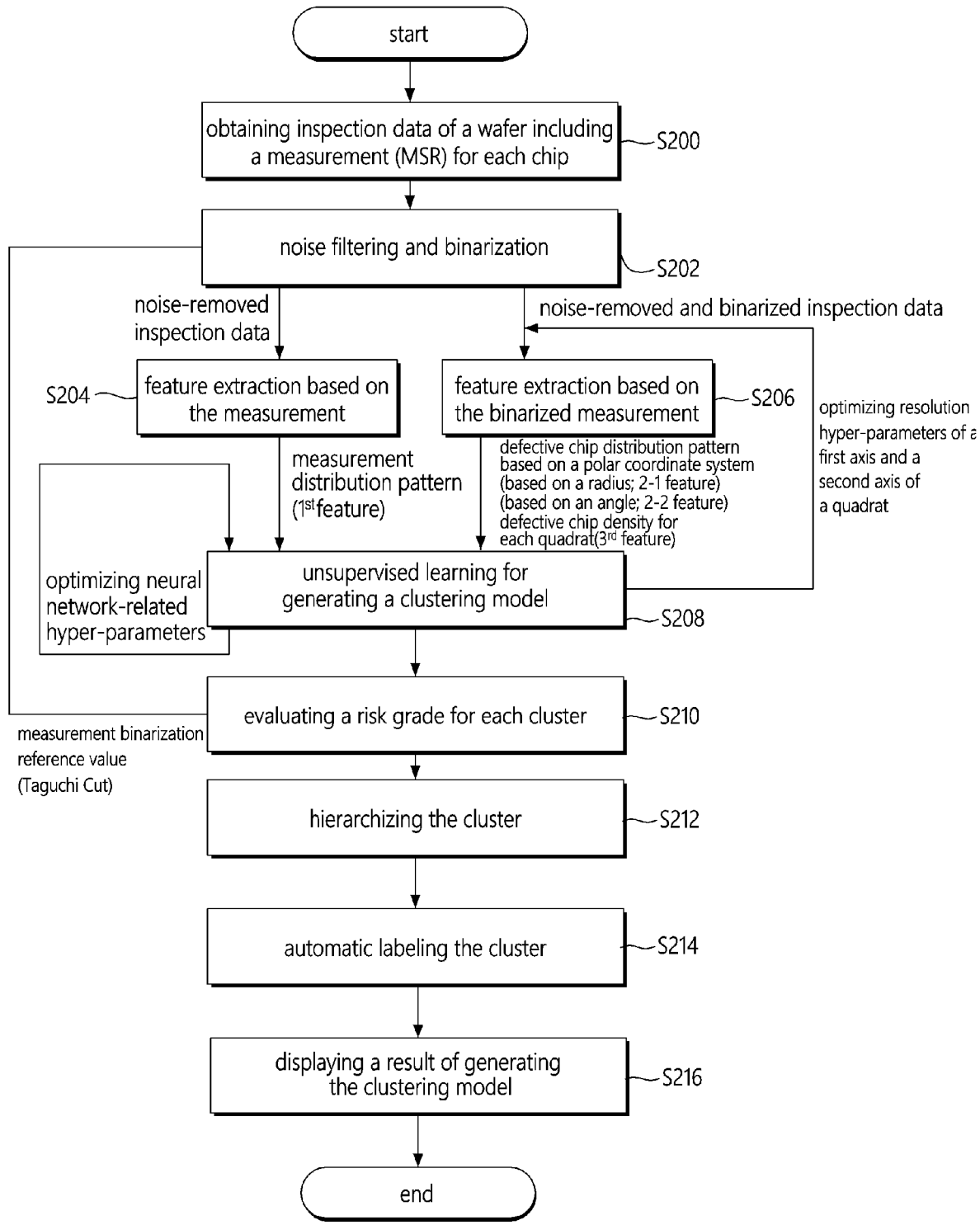
FIG. 8 is a flowchart of a method for detecting a pattern according to another embodiment of the present inventive concept.

FIG. 7 is a diagram for explaining in detail the method for removing the noise described with reference to FIG. 3 together with an example. Imaged original data 30-6 and original data 30-7 after the first noise removal (S107) and the binarization (S109) are shown in FIG. 7, it may be understood that in the imaged original data 30-6, points are formed at all coordinates Where VALUEs exist. As a result of the first noise removal and the binarization, it may be seen that a significant portion of the global noise has been removed. However, despite the first noise removal, local noise 30-7a still remains. The local noise 30-7a is removed by the second noise removal (S111).

As a result of removing noise, only necessary points for confirming a pattern existing in the original data are expressed in an image 30a-1 of the original data that is binarized. The method for removing the noise according to the present embodiment prevents outlier that is significantly different from a VALUE of an adjacent position from being blurred and being interfered with the recognition of important patterns in the adjacent position. Further, it has an effect of removing only a corresponding noise. This effect is obtained based on a new idea of the present inventive concept that removes the noise based on the three-dimensional spatial auto-correlation after three-dimensionalization of the two-dimensional data.

The method for removing the noise according to the present embodiment may be useful when the data has the smaller-the-better characteristic, Additionally, the method may be useful when the data has nominal-the-best characteristic and the VALUEs are close to a specific target value. When the data has the nominal-the-best characteristic, the method for removing the noise according to the present embodiment may be applied to an error between the original data and the target value.

For example, when the original data is a measurement for each coordinate (a first axis coordinate, a second axis coordinate) of a wafer, the method for removing the noise according to the present embodiment may be applied. Here, for the original data of each wafer, performing the first noise removal and performing the second noise removal may be repeated, and unsupervised learning for generating a defective pattern clustering model may be performed using data for each wafer after the first noise removal and the second noise removal are completed. Since the defect pattern clustering model is generated by the unsupervised machine learning, which may be performed without any prior labeling, it may be generated even with the original data itself. In a method for clustering a defect pattern based on unsupervised teaming according to the prior art, its performance cannot be commercialized due to noise. However, the method for clustering the defect pattern based on the unsupervised learning after the noise removal according to the present embodiment shows a level of clustering capability that may be commercialized. Further, the clustering capability is further enhanced by some embodiments of the invention described later.

Hereinafter, a method for detecting a pattern according to another embodiment of the present inventive concept will be described with reference to FIGS. 8 to 15. The method for detecting the pattern according to the present embodiment will be described in detail with reference to FIGS. 9 to 15 based on FIG. 8. The method for detecting the pattern according to the present embodiment may be implemented by a computing device. The computing device may be, for example, a data processing device described with reference to FIGS. 1 to 2. Hereinafter, each operation of the method for detecting the pattern according to the present embodiment will be described. It should be noted that in the case where there is no mention of the subject of each operation or expressed passively, the subject is the computing device.

A pattern detected according to the present embodiment may mean a pattern of two-dimensional numerical data. For example, the numerical data may be a quality characteristic having a smaller-the-better characteristic or a quality characteristic having a nominal-the-best characteristic. In addition, the two-dimensional numerical data may be a characteristic value related to the quality of each position of a semi-finished product or a finished product in a plane shape. When the semi-finished product or the finished product has a symmetrical shape based on a center point, a feature reflecting this feature may be further used for detection of a pattern.

The method for detecting the pattern according to the present embodiment performs accurate pattern detection by receiving the characteristic value itself related to the quality of each position of the semi-finished product or the finished product instead of photo information of the semi-finished product or the finished product in the plane shape. Since no matter how high-resolution pictures are, the picture information does not exhibit information loss in an encoding/decoding process of an image, blurring effects caused by spike-outliers in adjacent regions, and characteristics that are not visually reflected, accurate pattern detection is not easy.

Hereinafter, for understanding, the present embodiment will be described on the assumption that original data, which is a target of pattern detection, is measurement data for each chip of a wafer.

In step S200, original data including a measurement (MSR) for each chip is obtained. In other words, the original data is wafer inspection data. The original data may include measurements of all chips, or only measurements of some chips. When only the measurements of some chips are included in the original data, pre-processing for setting an initial value may be performed on a chip for which no measurement exists. The initial value is '0' when the measurement is a value of a smaller-the-better characteristic and is a target value according to a nominal-the-best characteristic when the measurement is a value of the nominal-the-best characteristic. When the measurement is the value of the nominal-the-best characteristic, pre-processing for correcting the measurement to an absolute value of (measurement-target value) may be additionally performed. In this case, the corrected measurement will be the value of the smaller-the-better characteristic.

In step S202, noise filtering and binarization are performed. The operation of this step may be performed with reference to the embodiments described with reference to FIGS. 3 to 6.

Using first noise-removed inspection data obtained according to step S202, in step S204, feature extraction is performed based on the measurement. Since a process of step S204 may be understood as a process of appropriately transforming an already extracted feature called a measurement, it may be understood as corresponding to a feature transformation. What may be understood as corresponding to the feature transformation is the same with step S206 which will be described later.

Step S202 will be described in detail with reference to FIG. 9. FIG. 9 is a diagram for explaining a role of a feature indicating a distribution pattern of measures in the course of learning a clustering model, used in the method for detecting the pattern described with reference to FIG. 8.

Figure 9:
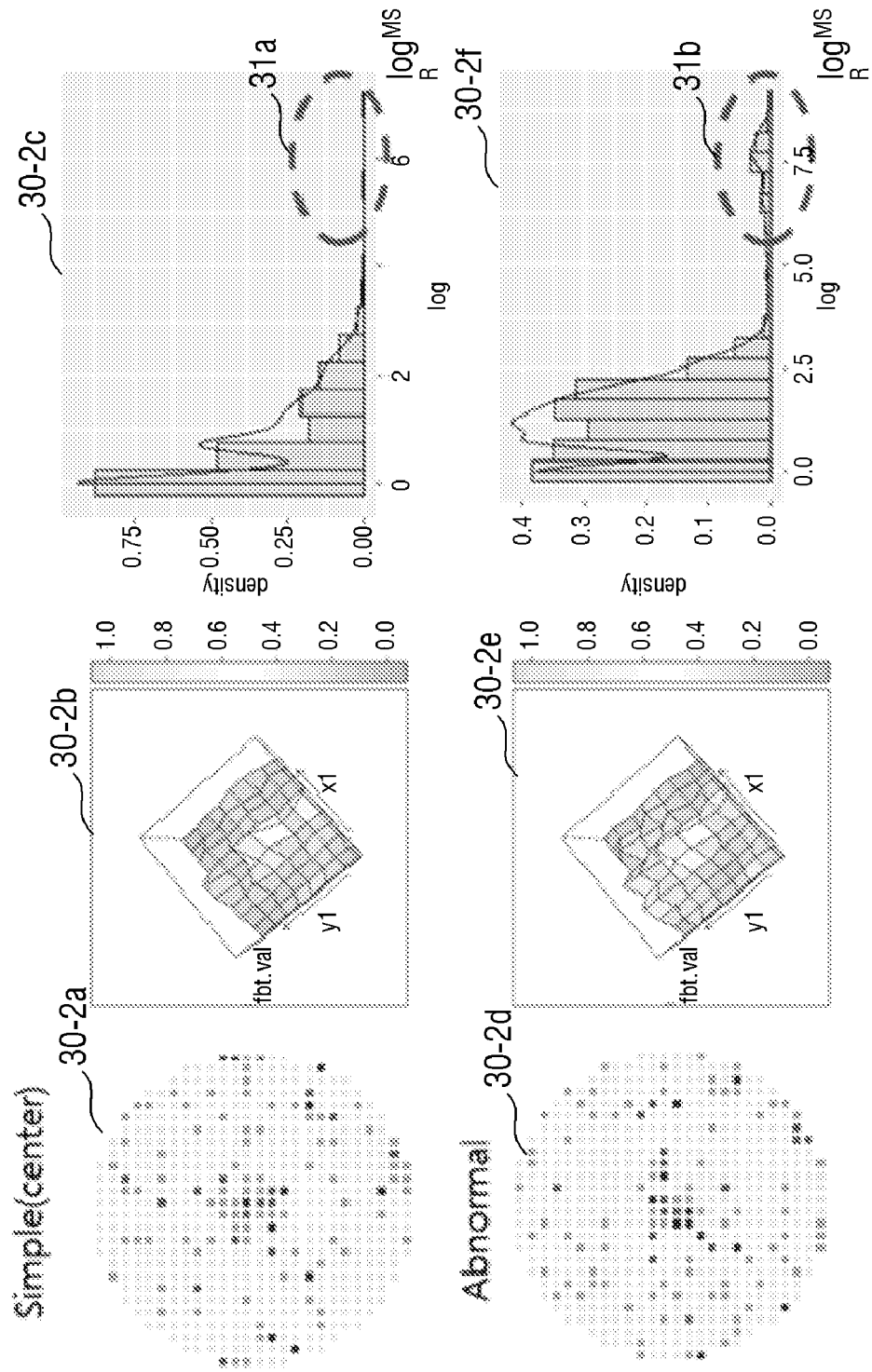
FIG. 9 is a diagram for explaining a role of a feature indicating a distribution pattern of measures in the course of learning a clustering model, used in the method for detecting the pattern described with reference to FIG. 8.

FIG. 9 is an imaged image 30-2a inspection data of a wafer having a defect of a center pattern and an imaged image 30-2h if inspection data of a wafer having a detect other than the center pattern. In the two images 30-2a and 30-2b, a measurement for each chip is represented by being replaced with a corresponding color. According to a convolutional neural network (CNN) based clustering method for a wafer inspection image according to the prior art, it is difficult to distinguish the two images 30-2a and 30-2b, This is because the two images 30-2a and 30-2b are visually very similar. Therefore, in order to perform pattern clustering precisely using the convolutional neural network (CNN) based clustering method, a structure of the neural network should be more complicated, such as increasing the number of hidden layers, and more training data should be secured. This is not easy in reality.

On the other hand, according to the present embodiment, when a feature (hereinafter referred to as a first feature) obtained based on a measurement distribution pattern obtained as a result of density estimation for the measurement is visually expressed, two very similar images are induced to be clearly distinguished in the course of learning a clustering model. It will be explained in more detail below.

FIG. 9 shows that when a result 30-2c of density estimation of measurement data 30-2b with a center pattern is compared with a result 30-2f of density estimation of measurement data 30-2e having an abnormal pattern other than the center pattern, portions 31a and 31b indicating a negative skewed distribution are clearly different. Considering that the measurement of the original data is a value having a smaller-the-better characteristic, for a wafer of normal quality, the result of the density estimation will show a gamma distribution skewed to a measurement close to zero, and the higher the wafer with abnormal quality, the result of the density estimation will show a negative skewed distribution compared to the gamma distribution.

Considering the fact that the measurement has the smaller-the-better characteristic, in other words, the first feature according to the present embodiment reflects the result of the density estimation of the measurement. In addition, the first feature will be a factor that clearly distinguishes two opposing patterns whose visual distribution is similar as shown in FIG. 9. Further, the first feature also indicates that the quality of the wafer itself is good or bad. Using these, when scoring is performed for each duster formed by the clustering model, or When a grade determination is performed for each cluster based on the scoring, the first feature of data belonging to each cluster may be a reference.

In an embodiment, the density estimation may refer to performing kernel density estimation. Here, the first feature may be defined by using at least some of parameters of the kernel density estimation, which express the result of the density estimation of the measurement, and the type of a kernel function. Referring to a result of kernel density estimation, that is, Equation 1 indicating the kernel density function $\hat{f}_h(x)$, the kernel function is expressed as 'K,' a width of a bin indicating an estimated interval in the density estimation is expressed as 'h,' and the measurement is expressed as xi:

$$\hat{f}_h(x) = \frac{1}{n}\sum_{i=1}^{n}K_h(x-x_i) = \frac{1}{nh}\sum_{i=1}^{n}K\left(\frac{x-x_i}{h}\right) \quad <\text{Equation 1}>$$

In other words, parameters such as 'h' for defining the kernel density function and an index value indicating the type of the kernel function may be reflected in the first feature. A number of well-known documents related to the kernel density estimation may be referred to.

It will be described with reference to FIG. 8 back again.

Using the noise-removed and binarized inspection data obtained in step S202, in step S206, feature extraction is performed. It has already been described that the feature extraction may be expressed by feature transformation. In step S206, a second feature capable of properly reflecting a feature of a shape side of an inspection object and a third feature capable of properly reflecting a feature of a distribution side of a defective chip in a wafer are extracted.

It will be described with reference to FIG. 10 in relation to the extraction of the second feature. In the case of products to be inspected that have a symmetrical shape based on a center point, such as a wafer, even if a first wafer and a second wafer have the same defect pattern, when an index of each chip is given in a rotated state with respect to the center point, there is a risk that they are recognized as different defect patterns. In addition, even if the first wafer and the second wafer have different defect patterns, when the index of each chip is given in the rotated with respect to the center point, there is a risk that they are recognized as the same defect pattern.

As an example of a shape that is symmetrical with respect to the center point, all shapes that do not have absolute top and bottom criteria such as a circle, an ellipse, an equilateral triangle, a square, and a pentagon may be considered.

Figure 10:
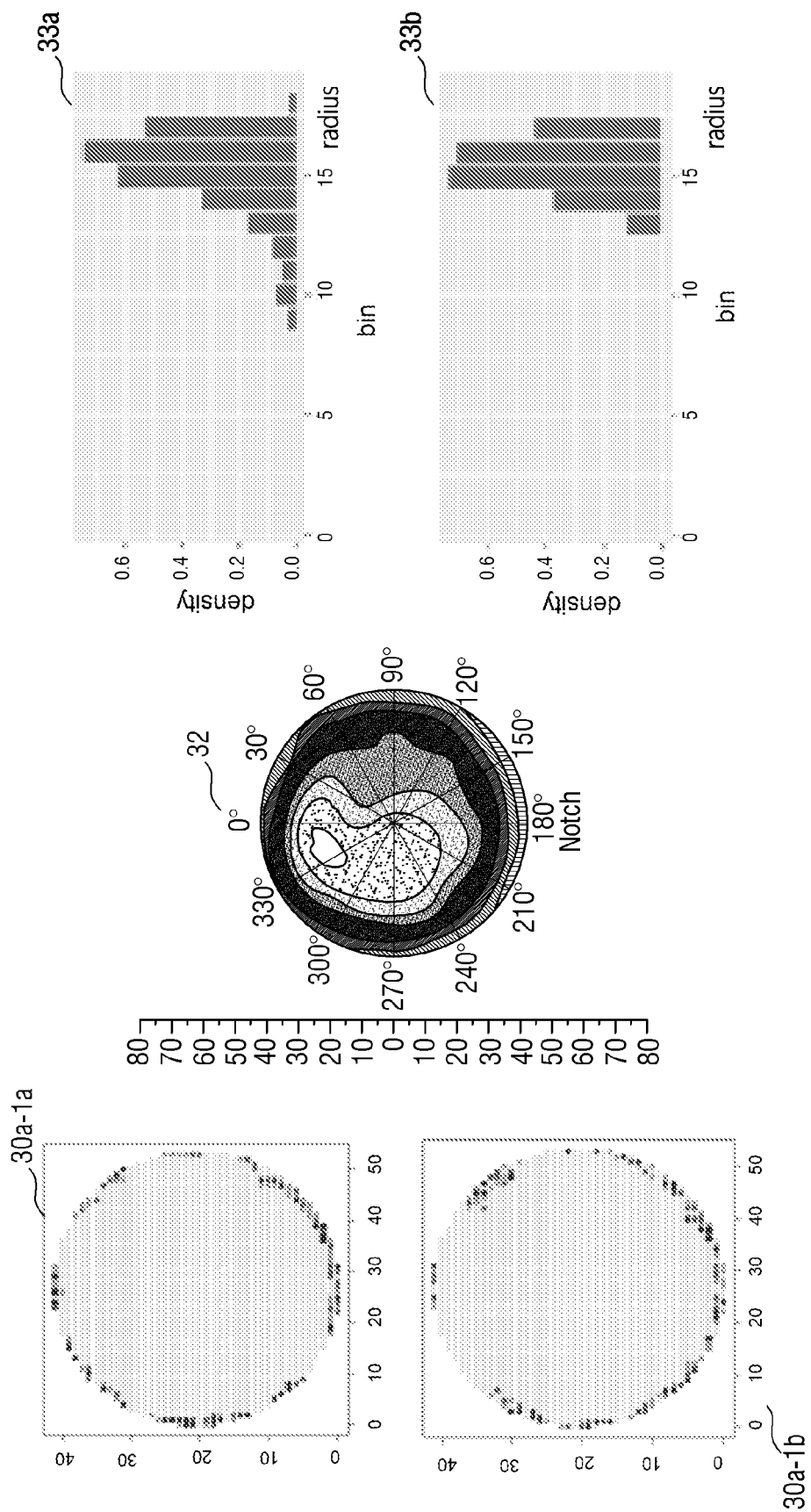
FIG. 10 is a diagram for explaining a role of a feature indicating a distribution pattern based on a polar coordinate system of defective chip distribution in the course of learning a clustering model, used in the method for detecting the pattern described with reference to FIG. 8.

For example, a defective chip distribution 30a-1a of the first wafer of FIG. 10 and a defective chip distribution 30a-1b of the second wafer are not well distinguished visually, Even the first feature of the first wafer and the second feature of the first wafer may be similar. Even in this case, the first wafer and the second wafer may be classified through a distribution pattern 32 according to polar coordinate system-based density estimation of a defective chip distribution. As illustrated in FIG. 10, the defective chip distribution 30a-1a of the first wafer and the defective chip distribution 30a-1b of the second wafer, which are not well distinguished from each other visually, are clearly distinguished by the defective chip distributions 33a and 33b based on the polar coordinate system.

FIG. 10 only shows the results 33a and 33b of the density estimation based on a radius from the center point. However, since coordinates of the polar coordinate system may be expressed using a radius and an angle, the second feature may also include a result of density estimation based on an angle.

In an embodiment, as same as the density estimation for extracting the first feature, the density estimation for extracting the second feature may also indicate performing the kernel density estimation. Here, the second feature may be defined by using at least some of parameters of the kernel density function, which express the result of the density estimation of the measurement, and the type of a kernel function.

In some embodiments, the second feature may be extracted from i) measurement which is not binarized nor noise-removed or ii) a measurement which is not binarized and only the first noise removal being done, rather than the noise-removed and binarized inspection data.

Figure 11:
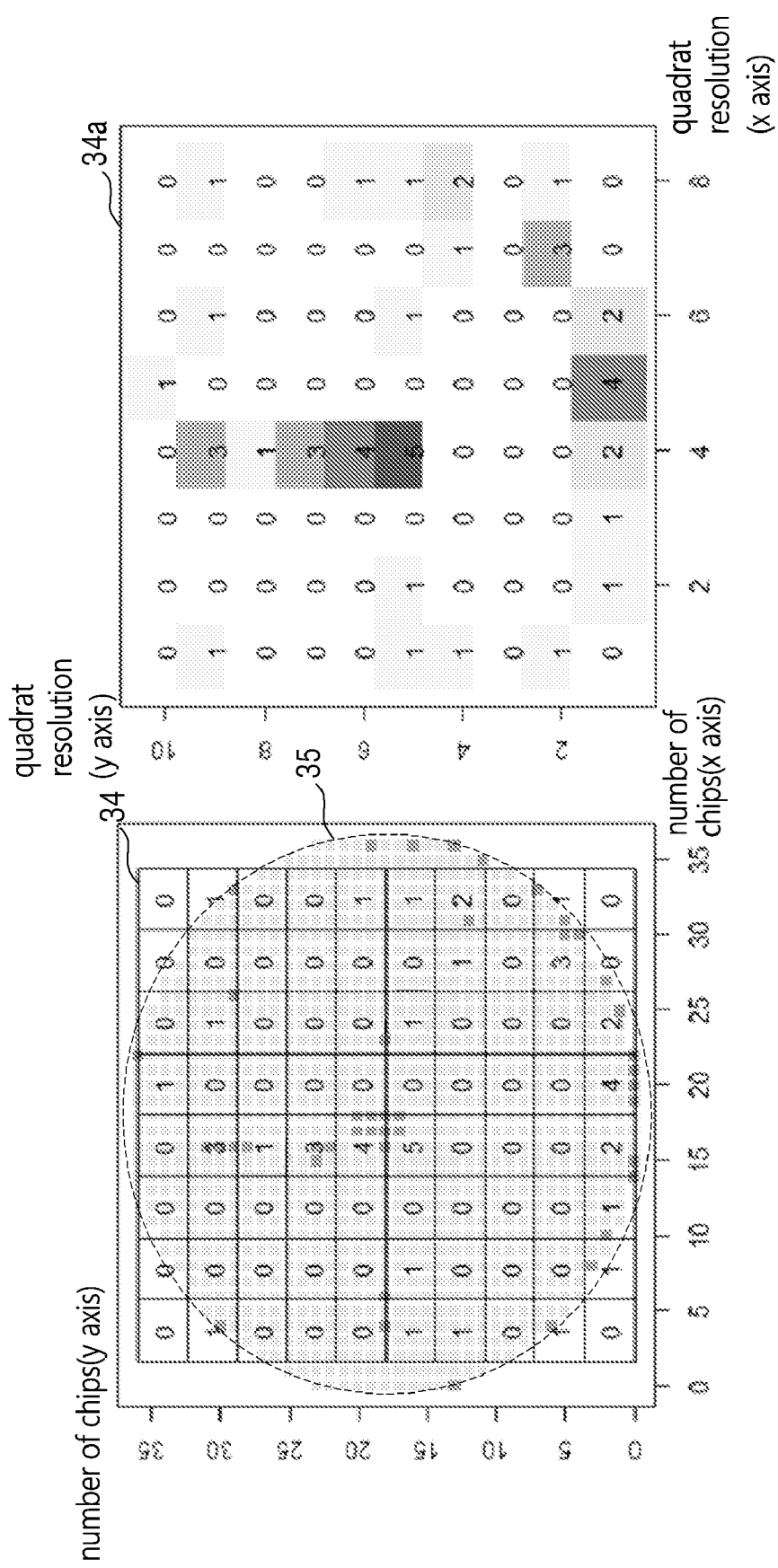
FIG. 11 is a diagram for explaining a role of a feature indicating a distribution pattern based on a polar coordinate system of defective chip distribution in the course of learning a clustering model, used in the method for detecting the pattern described with reference to FIG. 8.

It will be described with reference to FIG. 11 in relation to the extraction of the third feature. The third feature reflects the feature of the distribution side of the defective chip in the wafer in a noise-tolerant manner. To this end, a plurality of quadrats are formed virtually on a plane of the wafer. A size of the quadrat is defined using a resolution) on a first axis (x-axis) and a resolution q on a second axis x-axis), in which it is preferable that the size is defined so that at least two chips are included in one quadrat. FIG. 11 shows a situation in which a quadrat 34 in which the first axial resolution p and the second axial resolution q are respectively defined as 4 is virtually partitioned on a wafer 35.

As the unsupervised learning of step S208 progresses, the first axis resolution p and the second axis resolution q of the quadrat may start with initial setting values, and may be updated with hyper-parameter optimization such that a value of a loss function representing a degree of grouping of each cluster formed according to a trained model is minimized. Finding optimal p and q values according to the hyper-parameter optimization may be performed using various optimization algorithms such as a genetic algorithm. For example, in a search strategy for finding optimized p and q, an evolutionary search may be utilized.

When the p and q are updated according to the hyper-parameter optimization, the p and q values at the start of learning and the p and q values at the end of learning will be different from each other. Therefore, secondary unsupervised learning may be performed after setting the p and q values at the time when learning is completed to new initial p and q values. This additional unsupervised learning may be repeated until the p and q values are no longer updated according to the hyper-parameter optimization.

It may be understood that the loss function, which expresses the degree of grouping of each cluster, a function in which as a feature of data in a cluster is similar and a feature of a different cluster is different, the value of the loss function is reduced. In other words, the loss function is a fun NI in which as a density of data inside a cluster is high in a feature space and a distance between clusters increases, the value of the loss function decreases. Here, t density of the data inside the cluster and the distance between the clusters may mean a Euclidean distance. However, in some embodiments, a metric for measuring a distance in the feature space may be updated by metric learning. In this regard, reference is made to a number of well-known documents related to a number of deep metric learning.

Each quadrat has the number of defective chips contained therein. In other words, each quadrat may represent a density 34a of the defective chip. In FIG. 11, it may be seen that the corresponding color reflects the density 34a of the defective chip in each quadrat.

As a feature of the distribution side of the defective chips of the wafer, instead of the distribution of the defective chips of each wafer, by using the density of the defective chips of each quadrat, it is possible to obtain an effect that the clustering model is trained by focusing on a region in which the defective chips are dense.

In some embodiments, by determining the density of the defective c ups in the quadrat as a result of standardization or normalization of the number of defective chips in each quadrat, the clustering model may be trained by focusing on the distribution of the defective chips considering a relative density of the defective chips of each quadrat, not an absolute density of the defective chips of each quadrat. For example, it is assumed that only a density of defective chips in a central portion of the first wafer is high and its density is about 10, and only a density of defective chips in a central portion of the second wafer is high and its density is about 2. When it is separate that the first wafer and the second wafer are distinguished from each other in terms of the first feature and the second feature, and when the number of defective chips in each quadrat is standardized or normalized, and the density of the defective chips in the quadrat is determined, it may be determined that the first wafer and the second wafer are similar at least in terms of the third feature.

So far, description has been made with respect to the feature extraction according to the present embodiment. At least some of the first feature, the second feature, and the third feature may be used for the unsupervised learning for generating the clustering model (S208). Hereinafter, the unsupervised learning for generating the clustering model will be described in detail with reference to FIG. 12.

Figure 12:
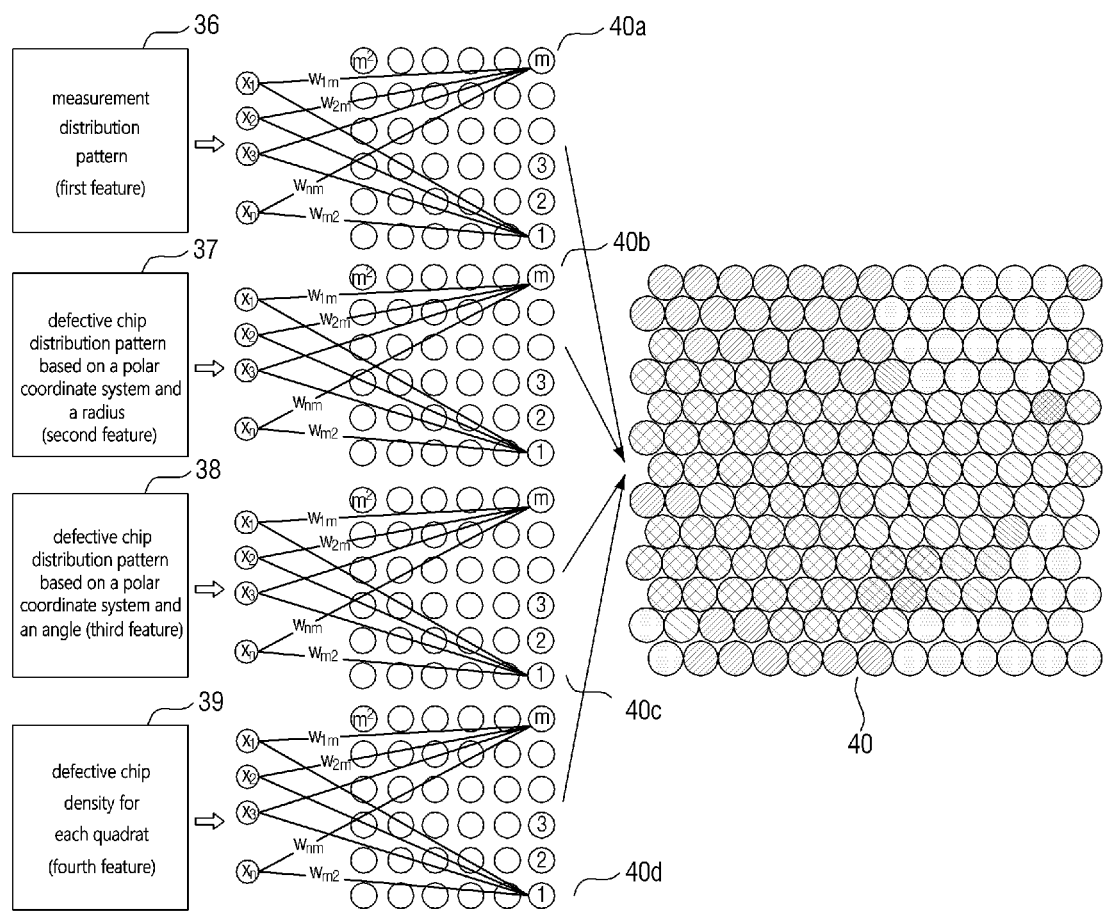
FIG. 12 is a diagram for explaining in detail an unsupervised learning process of a clustering model performed in the method for detecting the pattern described with reference to FIG. 8.

As shown in FIG. 12, a self-organizing map algorithm may be used to generate the clustering model. It may be understood that since there are a plurality of input features, in this respect, the self-organizing map algorithm is, in particular, a multi-objective self-organizing map algorithm.

According to the self-organizing map algorithm, learning is performed in such a way that each node of a competition layer is updated according to each feature vector input to an input layer. It may be understood that since a clustering model must be generated to achieve several purposes according to the present embodiment, a first neural network 40a to which a first feature 36 is input and trained, a second neural network 40b to which a first feature 37 is input and trained, a third neural network to which a third feature 38 is input and trained, and a fourth neural network 40d to which a fourth feature 39 is input and trained are summed by reflecting respective weights $w_1$, $w_2$, $w_3$, and $w_4$, and thus, a final clustering model 40 is formed.

When learning according to the self-organizing map algorithm is completed, a representative feature vector for each cluster may be output through an output layer for each target layer. In other words, in an example shown in FIG. 12, a representative vector for each cluster of the first feature 36, a representative vector for each cluster of the second feature 37, a representative vector for each cluster of the third feature 38, and a representative vector for each cluster of the fourth feature 39 may be output.

In addition, the number 11 of nodes in a first axis of a competition layer, the number 12 of nodes in a second axis of a competition layer, weights $w_1$, $w_2$, $w_3$, and $w_4$ between each feature, and the number N of clusters formed by the clustering model may be updated with hyper-parameter optimization so that the value of the loss function representing the degree of grouping of each cluster formed according to the trained model is minimized. Finding optimal hyper-parameters $l_1$, $l_2$, $w_1$, $w_2$, $w_3$, $w_4$, and N according to the hyper-parameter optimization may be performed by using various optimization algorithms such as a genetic algorithm. For example, in a search strategy for finding optimized hyper-parameters $l_1$, $l_2$, $w_1$, $w_2$, $w_3$, $w_4$, and N, an evolutionary search may be utilized.

When the hyper-parameters $l_1$, $l_2$, $w_1$, $w_2$, $w_3$, $w_4$, and N are updated according to the hyper-parameter optimization, the hyper-parameters $l_1$, $l_2$, $w_1$, $w_2$, $w_3$, $w_4$, and N at the start of learning and the hyper-parameters $l_1$, $l_2$, $w_1$, $w_2$, $w_3$, $w_4$, and N at the end of learning will be different from each other. Therefore, after setting the hyper-parameters $l_1$, $l_2$, $w_1$, $w_2$, $w_3$, $w_4$, and N at the end of learning as new initial hyper-parameters $l_1$, $l_2$, $w_1$, $w_2$, $w_3$, $w_4$, and N, secondary unsupervised learning may be performed. This additional unsupervised learning may be repeated until the update of the hyper-parameters $l_1$, $l_2$, $w_1$, $w_2$, $w_3$, $w_4$, and N according to the hyper-parameter optimization is no longer necessary.

When the learning of the clustering model 40 is completed, scoring based on each cluster formed by the trained clustering model 40 and a grade based thereon are given (S210). In this regard, it will be described in detail with reference to FIG. 13.

As described above, when a measurement has a smaller-the-better characteristic, scoring for each cluster may be possible through a distribution of the measurement of data belong to each cluster. For example, when a measurement of a first cluster is lower than a measurement of a second cluster, the first cluster may receive a better score than the second cluster.

In the present embodiment, the scoring for each cluster based on these criteria is presented more precisely based on the Taguchi model. For example, it will be possible to determine how a distribution of a probability density of measurements of all wafers in a cluster, which is created as a result of summing a distribution of measurements for each wafer belonging to each cluster, is negatively skewed distributed.

Figure 13:
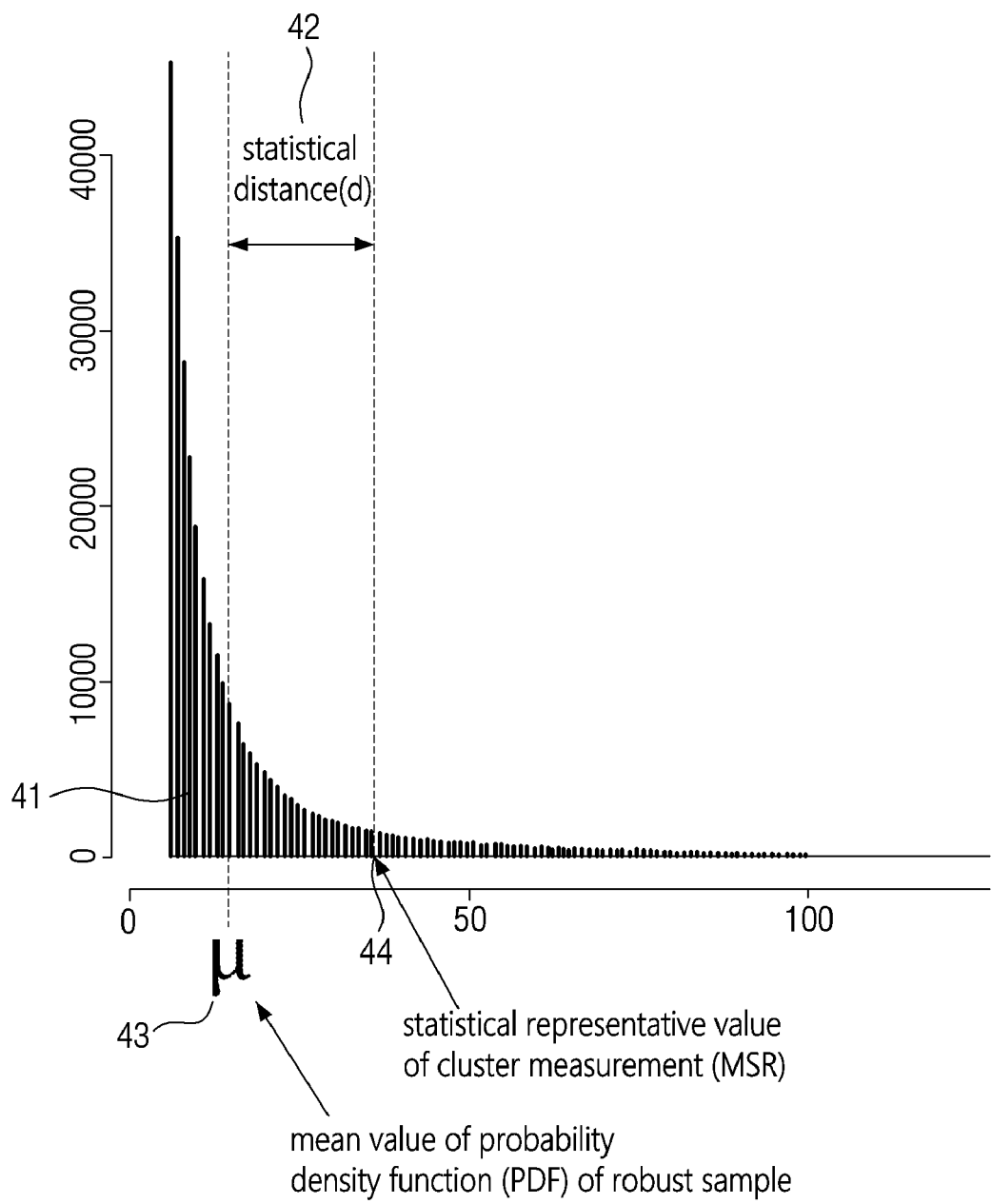
FIG. 13 is a diagram for explaining in detail a process to evaluate a cluster grade performed in the method for detecting the pattern described with reference to FIG. 8.

FIG. 13 shows a histogram 41 for each measurement of all the trained wafers. Since the measurement has the smaller-the-better characteristic, the histogram 41 in which a plurality of inspection data is accumulated will have a gamma distribution. On the premise of this, a probability density function (PDF) of the histogram 41 may be composed of the following equation:

$$f(x; k, \theta) = \frac{1}{\Gamma(k)\theta^k} x^{k-1} e^{-\frac{x}{\theta}} \qquad <\text{Equation 2}>$$

In Equation 2, k means a shape parameter, and θ means a scale parameter.

When obtaining the probability density function of the histogram 41, sample data obtained by robustly sampling 75% of the total data may be applied to the entire parameter using a bootstrap method. The bootstrap sampling may be performed by extracting sample data according to a minimum positive skewed gamma distribution.

Then, after obtaining the probability density function of the gamma distribution using the parameter, a mean value μ and standard deviation σ of the parameter data are obtained using the probability density function. Then, using the mean value μ and the standard deviation σ, grade classification of each cluster may be performed with Taguchi loss probability-based quality rating.

A description will be given with reference to FIG. 13. The farther a statistical distance 42 between the mean value 43 of the parameter and a representative value of measurement statistics 44 of a specific cluster, the poorer e score and grade of the specific cluster will be. The representative value of the measurement statistics 44 may be any one of a mean, a median, or a mode.

In one embodiment, the Taguchi loss probability-based quality grade may be ranked in the following 6 grades.

When the representative value of the measurement statistics of the cluster is M, 1st grade (best): M<(μ−6σ)
2nd grade: (μ− 6σ)≤M<(μ−3σ)
3rd grade: (μ−3σ)≤M<(μ−σ)
4rth grade: (μ−σ)≤M<(μ+σ)

5th grade: $(\mu+\sigma) \leq M < (\mu+3\sigma)$

6th grade: $(\mu+3\sigma) \leq M < (\mu+6\sigma)$

7th grade (worst): $(\mu+6\sigma) < M$

In addition, as already described, any one of reference values according to the grade classification criteria may be a reference value of the binarization as a reference value when a measurement is binarized in a noise filtering process. For example, $(\mu+\sigma)$ which is an upper limit value of the fourth grade and a lower limit value of the fifth grade, and $(\mu-\sigma)$ which is an upper limit value of the third grade and an lower limit value of the fourth grade may be the reference value of the binarization. For example, if the reference value of the binarization is $(\mu-\sigma)$, it is binarized to '0' according to the binarization when a measurement is less than $(\mu-\sigma)$, and it is binarized to '1' according to the binarization when the measurement is $(\mu-\sigma)$ or more.

As such, the binarized measurement used in the noise filtering or the feature extraction are set according to statistically sophisticated criteria, thereby contributing to the accurate clustering results.

Figure 15:
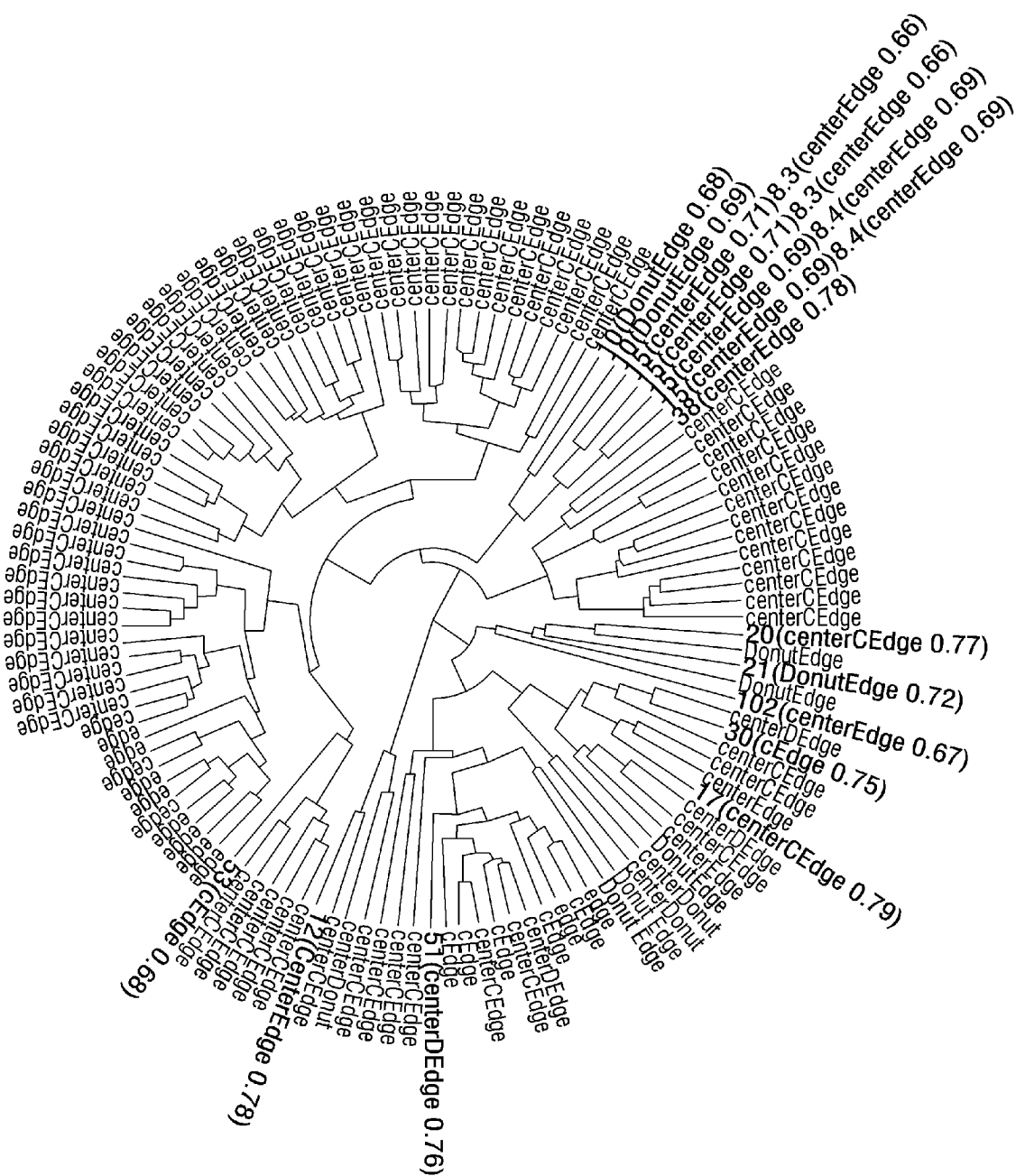
FIG. 15 is a diagram for explaining results of hierarchizing and automatic labeling a cluster described with reference to FIG. 8.

Referring again to FIG. 8, in step S212, cluster hierarchizing is performed through merging between similar clusters. Here, for similarity between clusters, a well-known pattern similarity determination method between clusters is used. For example, a ratio of intersection elements between two clusters may exceed a reference value (for example, 85%), or two clusters having a cosine similarity or higher than a reference value may be merged into one integrated cluster at a higher hierarchy. In addition, the higher the hierarchies, the more likely the standard of merging will be relaxed. The cluster hierarchizing may be performed by repeating a similar cluster merging process. FIG. 15 shows an exemplary result in which the cluster hierarchizing is completed.

Figure 14:
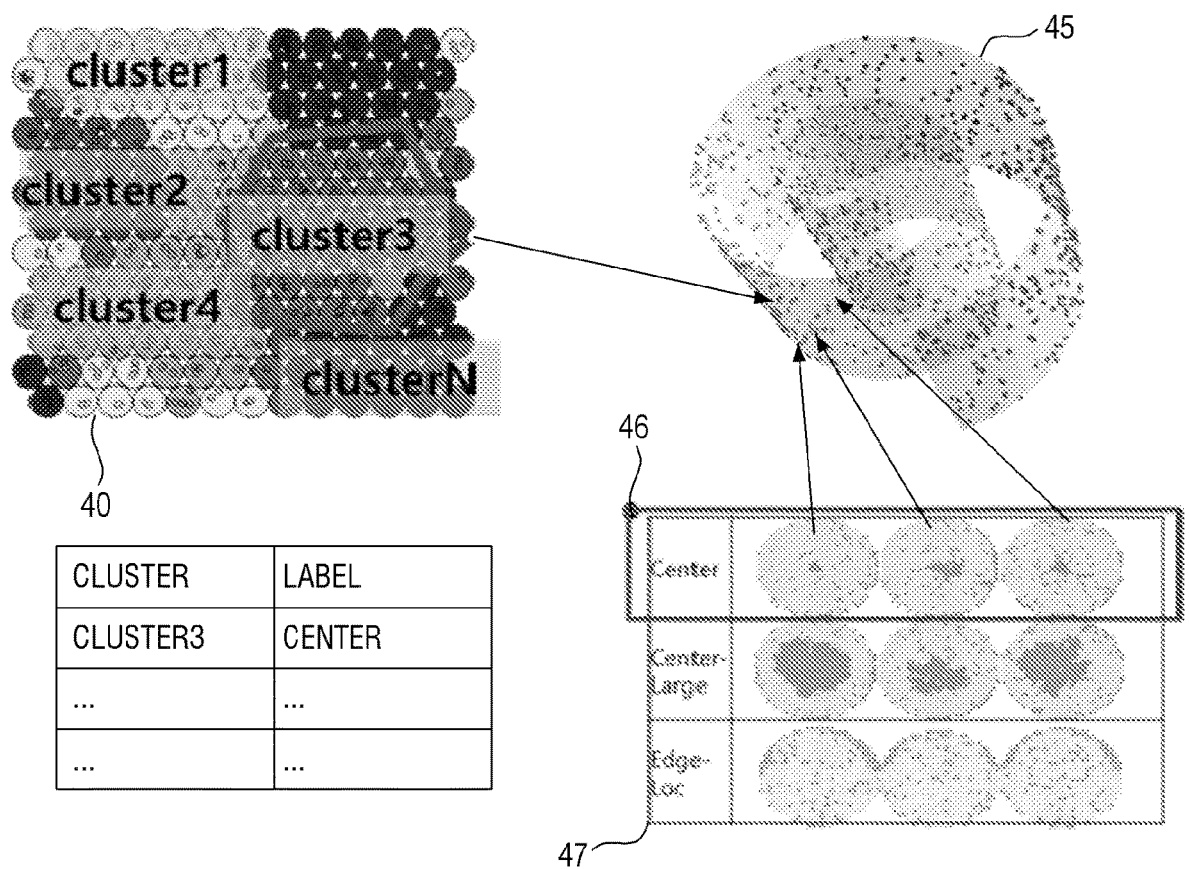
FIG. 14 is a diagram for explaining in detail a process for automatically labeling a cluster performed in the method for detecting the pattern described with reference to FIG. 8.

Next, in step S214, automatic labeling is performed through comparison with labeled measurement data. It will be described in detail with reference to FIG. 14. As illustrated in FIG. 14, defect pattern may be labeled for a part of wafer inspection data. FIG. 14 shows a table 47 of a part of wafer inspection data for which labeling has been completed. In addition, the part of wafer inspection data for which labeling has been completed and wafer inspection data classified into a specific cluster by the clustering model 40 may be mapped to an adjacent region on a manifold 45. In this case, the automatic labeling for the specific cluster is performed using a label of the wafer inspection data mapped to the adjacent region on the manifold 45. The manifold may be configured by supervised learning.

For example, when a 'center' pattern of FIG. 14 and a cluster 3 clustered by the cluster model 40 are mapped to an adjacent region on the manifold 45, the automatic labeling may be performed on the cluster 3 as the 'center' pattern.

FIG. 15 shows an exemplary result in which the cluster hierarchizing and the automatic labeling are completed. According to an embodiment, at least one of notification priority and display priority may be adjusted for a specific cluster depending on a user's manipulation. For example, notification or display may be deactivated for remaining clusters except for a cluster highlighted in FIG. 15 depending on the user's operation. Accordingly, user convenience may be provided in which the user may check only a detect pattern of the type of interest.

Next, in step S216, a result of generating the clustering model is displayed. The clustering model is generated using all of the wafer inspection data obtained in step S200, in which the result of generating the clustering model may include scoring and grading results for each cluster, inquiry of inspection data belonging to each cluster, checking a hierarchical structure of each cluster, and automatic labeling results of each cluster.

Next, a method for detecting a defect in a wafer according to another embodiment of the present inventive concept will be described with reference to FIGS. 16 to 22. The method for detecting the defect in the wafer according to the present embodiment will be described in detail with reference to FIGS. 17 to 22 based on FIG. 16. The method for detecting the defect in the wafer according to the present embodiment may be implemented by a computing device. The computing device may be, for example, a data processing device described with reference to FIGS. 1 to 2. Hereinafter, each operation of the method for detecting the defect in the wafer according to the present embodiment will be described it should be noted that in the case where there is no mention of the subject of each operation or expressed passively, the subject is the computing device.

It may be understood that the method for detecting the defect on the wafer according to the present embodiment may be performed in a state in which a clustering model is generated according to the method for detecting the pattern described with reference to FIGS. 8 to 15. Hereinafter, the present embodiment will be described with reference to FIG. 16.

In step S200, wafer inspection data including measurement for each chip is obtained, and in step S202, noise filtering and binarization are performed. In the manner already described with reference to FIGS. 8 to 15, extraction of a first feature (S204) and extraction of a second feature and a third feature (S206) is performed from the wafer inspection data. A cluster to which the wafer inspection data belongs is identified by inputting at least some of the first to third features into the clustering model previously generated in step S220.

A cluster with scratch type defect patterns and SHOT type defect patterns frequently found on wafers may be detected in parallel through a separate detection logic without the use of the clustering model.

Figure 16:
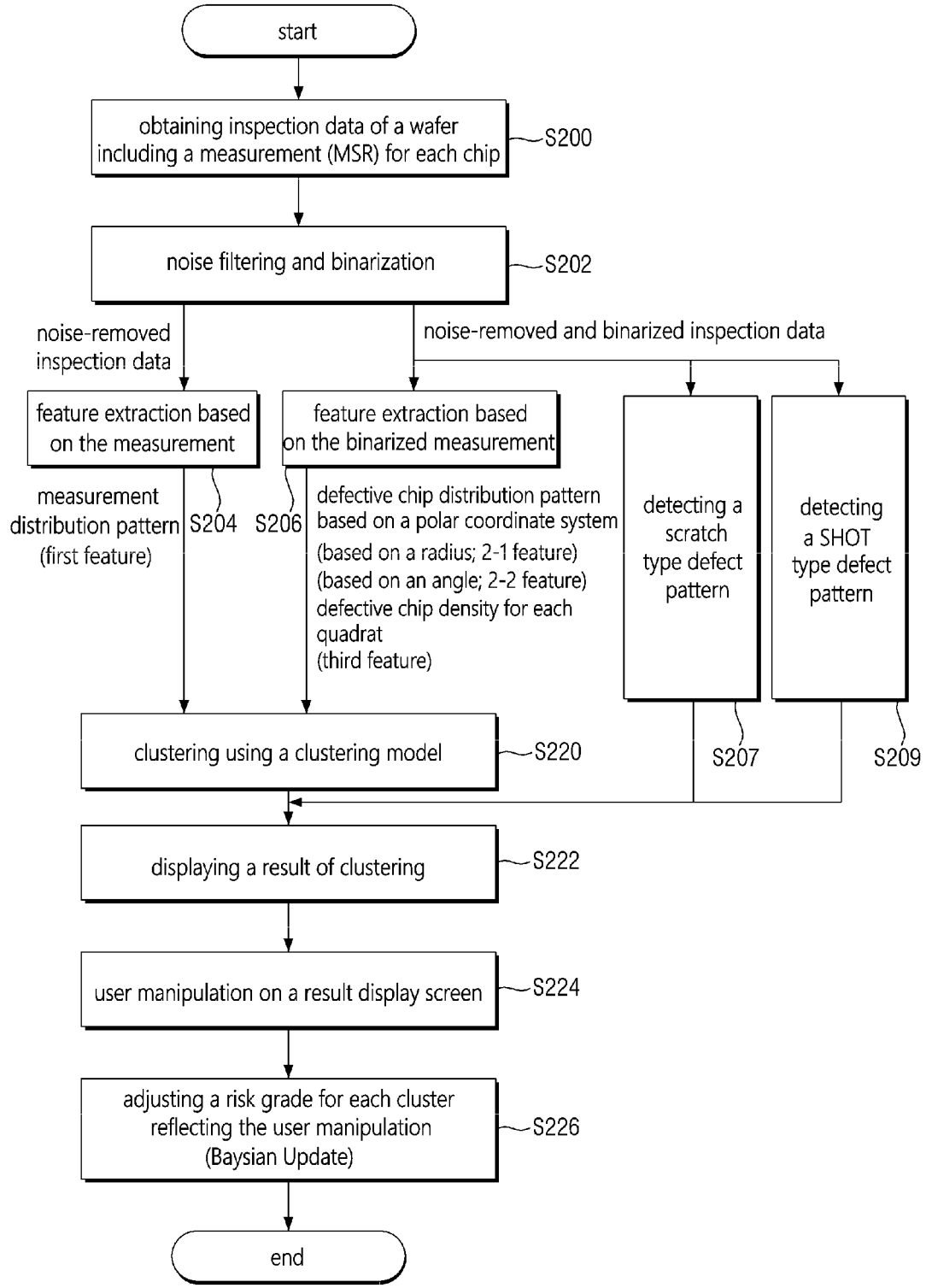
FIG. 16 is a flowchart of a method for detecting a defective pattern of a wafer according to another embodiment of the present inventive concept.

It is noted that although FIG. 16 shows that clustering using the clustering model (S220) and scratch type defect pattern detection (S207) and shot type defect pattern detection (S209) are performed in parallel, the scratch type defect pattern detection (S207) or the shot type defect pattern detection (S209) may be independently performed depending on embodiments. Naturally, in order to perform the scratch type defect pattern detection (S207) or the shot type defect pattern detection (S209) independently, it is obvious that the operation of the previous step, that is, the operation of obtaining the wafer inspection data (S200) and the noise filtering and binarization operation (S202) are preceded. Hereinafter, it will be described in more detail with reference to FIGS. 17 to 20.

Figure 17:
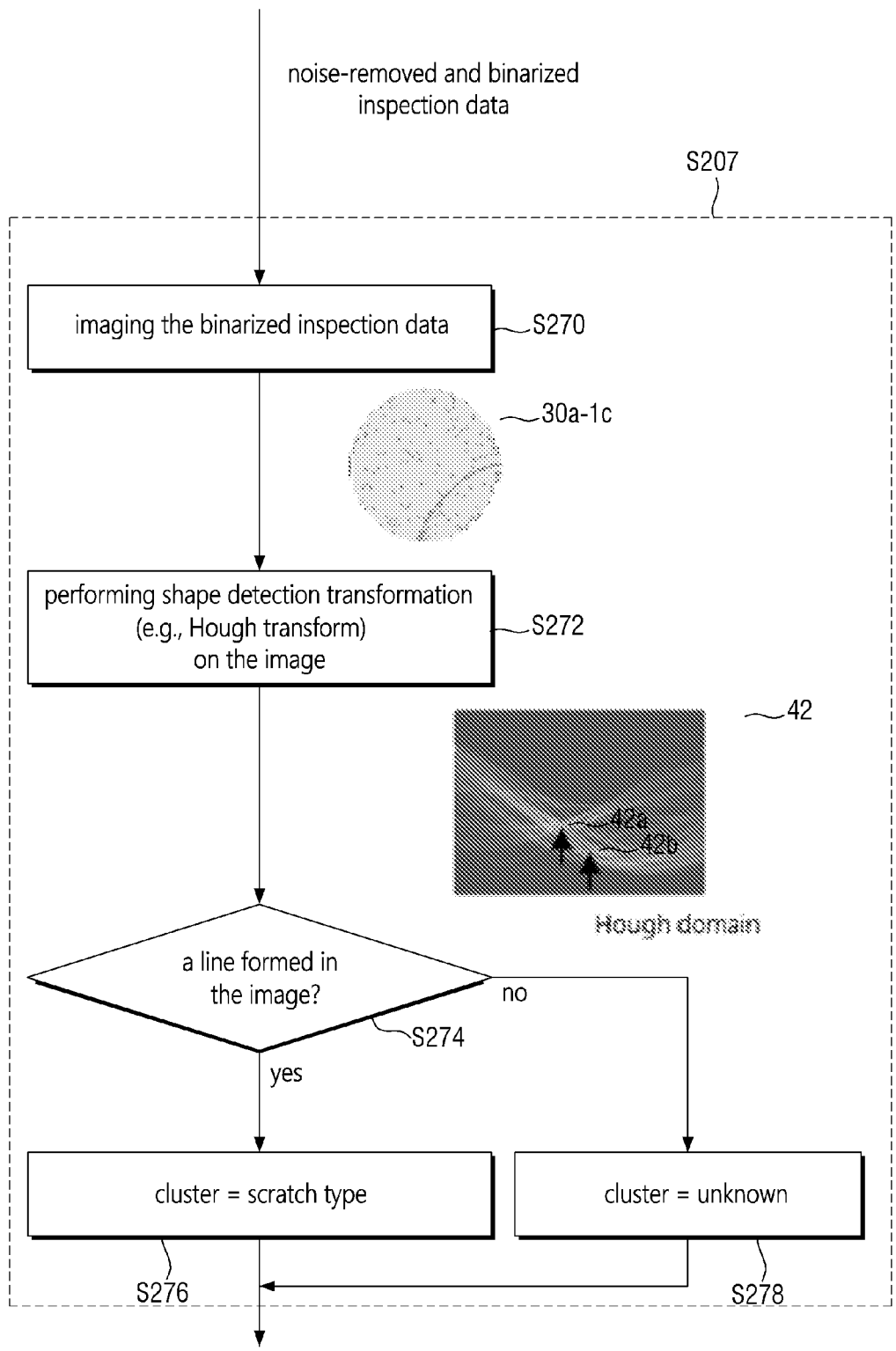
FIG. 17 is a diagram for explaining in detail a process for detecting a scratch type cluster first performed in the method for detecting the defective pattern of the wafer described with reference to FIG. 16.

FIG. 17 is a detailed flowchart of a method (S207) for determining whether wafer inspection data belongs to a scratch type cluster.

In step S270, the noise-removed and binarized inspection data is imaged. The noise-removed and binarized inspection data will include information on a position of a defective chip among respective chips arranged on a two-dimensional plane and may be imaged by displaying a point at a position of each defective chip. FIG. 17 shows imaged and binarized inspection data 30*a*-1*c*.

In step S272, shape detection transformation is performed on the images 30*a*-1*c*. As for the shape detection transformation, for example, Hough transform, Radon transformation or the like may be considered. For convenience of understanding, the present embodiment will be described as an example in which the Hough transform is performed.

In the case where a scratch type defect occurs, if its wafer inspection data is imaged, a connected straight-line shape appears. In addition, when Hough transforming an image of the wafer inspection data, peaks 42a and 42b are formed on a Hough domain 42 after transformation. The position and number of the peaks 42a and 42b on the Hough domain 42 are analyzed to determine whether the connected straight-line shape (line) is formed in the image 30a-1c of the wafer inspection data (S274).

Depending on a result of determination (S274), it will be determined whether the input wafer inspection data should be clustered into a scratch type (S276) or whether a, scratch type defect does not exist in the wafer inspection data (S278). FIG. 18 shows exemplary images of wafer detective chips that may be detected according to a scratch type cluster priority detection process described with reference to FIG. 17.

Figure 19:
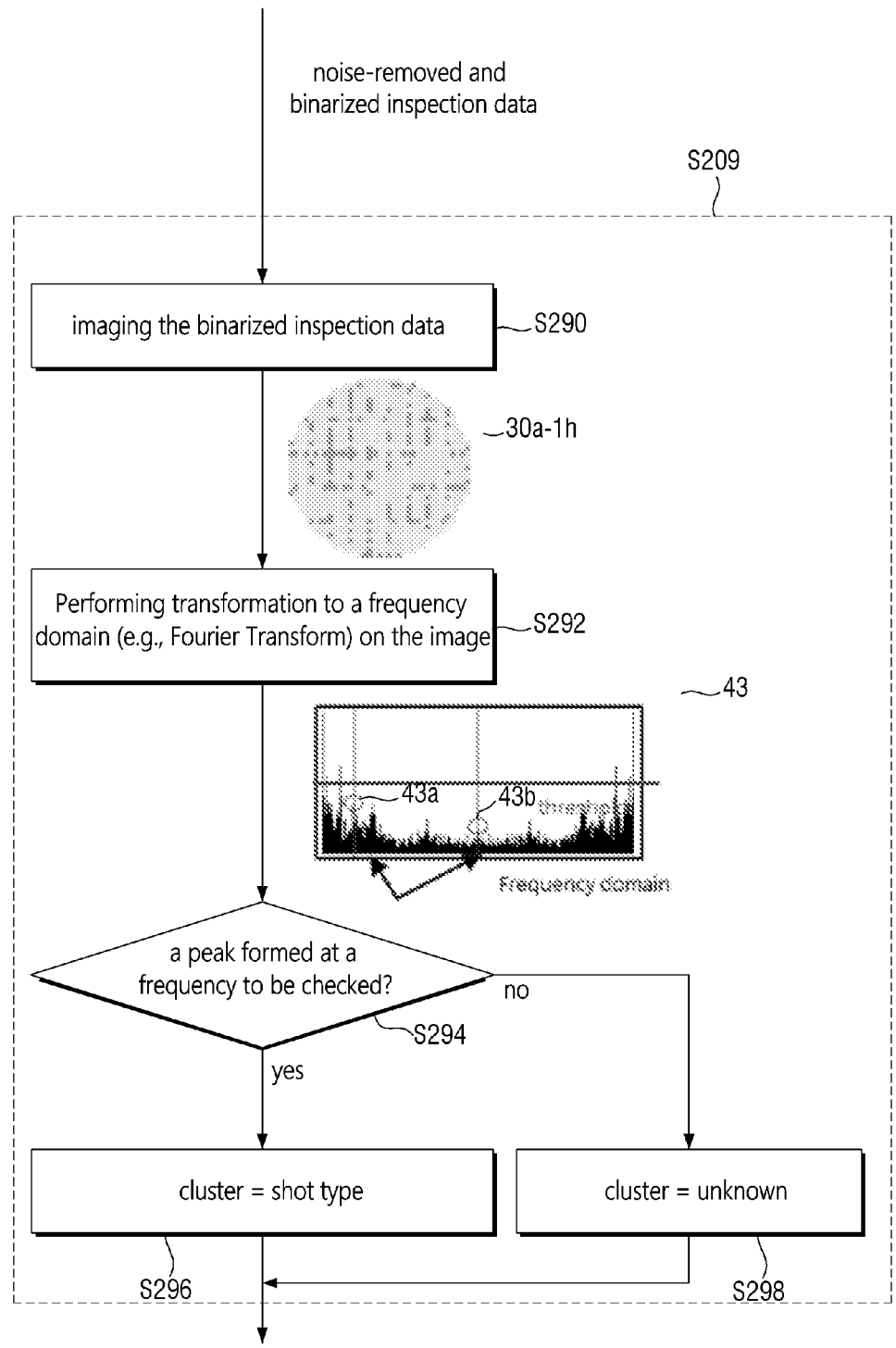
FIG. 19 is a diagram for explaining in detail a process for detecting a shot type cluster first performed in the method for detecting the defective pattern of the wafer described with reference to FIG. 16.

Next, a method for determining whether wafer inspection data belongs to a shot type duster (S209) will be described in detail with reference to FIG. 19.

In step S290, the noise-removed and binarized inspection data is imaged. The noise-removed and binarized inspection data will include information on a position of a defective chip among respective chips arranged on a two-dimensional plane and may be imaged by displaying a point at a position of each defective chip. FIG. 19 shows binarized inspection data which is imaged 30a-1h.

In step S292, transformation to a frequency domain is performed on the images 30a-1h. For the transformation to the frequency domain, for example. Fourier transform or Wavelet transformation may be considered. For convenience of understanding, the present embodiment will be described as an example in which the Fourier transform is performed.

In the case where a shot type defect occurs, if its wafer inspection data is imaged, repetitive groups appear at regular intervals. In addition, when an image of the wafer inspection data is Fourier transformed, peaks 43a and 43b are formed at a specific frequency on a frequency domain 43 after the transformation. The specific frequency will depend on the type of equipment or process that causes a chip size or shot type defect in a wafer. Since the chip size of the wafer is easily known, it is easy to identify the type of equipment or process that causes the shot type defect based on a frequency at which the peak is formed.

In other words, when the shot type defect occurs, the frequency (a frequency band for which the shot type is monitored) at which the peak may be formed on the frequency domain 43 may be preset. A frequency band to be monitored for the shot type may include a plurality of frequency domains.

Figure 20:
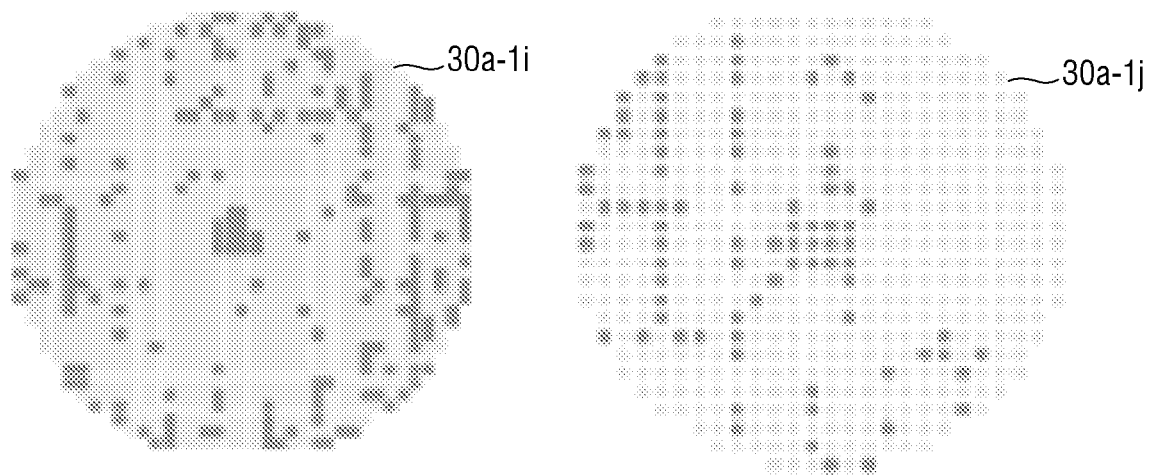
FIG. 20 is images of exemplary wafer defective chips that may be detected according to the process for detecting the shot type cluster first described with reference to FIG. 19.

When a peak is formed in at least part of the frequency band to be monitored for the shot type (S294), input wafer inspection data should be clustered in the shot type (S296). When no peak is formed on the frequency domain 43, or when a peak is formed only at ta frequency that is greater or equal to a reference value compared to the frequency band to be monitored for the shot type (S294), it should be determined that there is no defect of the shot type in the input wafer inspection data (S298). FIG. 20 shows images of exemplary wafer defective chips that may be detected according to the shot type cluster priority detection process described with reference to FIG. 18.

It will be described with reference to FIG. 16 back again.

In step S222, a result of clustering using the clustering model, a result of the scratch type defect pattern detection using the a scratch type defect pattern detection model, and a result of the shot type defect pattern detection using the shot type defect pattern detection model are aggregated, and a result of clustering is displayed (S222). Here, a result displayed on a user terminal may include, of course, identification information of a cluster to which data to be inspected for clustering belongs to, and may even include a result of scoring and grading the cluster, position information in a hierarchical structure of the cluster, and a result of automatic labeling of the cluster.

According to the present inventive concept, a user manipulation performance on a clustering result display screen is monitored (S224), and a result of monitoring the user manipulation performance may reflected and a score of each cluster and a result of grading accordingly may be updated (S226), This is an example of a unique cluster grade update applied in some embodiments of the present inventive concept, in which a prior probability of each cluster is determined based on the grade according to the Taguchi cut given by using the fact that a measurement has a smaller-the-better characteristic, and after an event of a user manipulation, Bayesian update, which is a theory of the fact that the prior probability may be updated with a posterior probability, is considered.

The first assumption that should be understood is that the user is not curious about information related to a cluster to which data having normal patterns belong. Therefore, user manipulation will not occur for a cluster that is given a score that may be understood to have a low level of risk. When a cluster was given a score that could be understood as having a low risk and although a normal grade is given accordingly, if a user manipulation for inquiry or data export to the cluster is frequently occurring, the cluster is likely to have an abnormal pattern.

Figure 22:
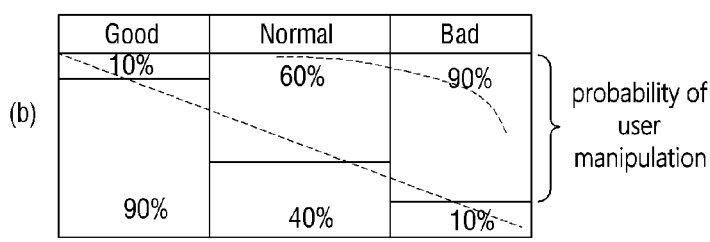

Hereinafter, the update operation S226 of a cluster grade will be described in more detail with reference to FIGS. 21 to 22.

A table shown in FIG. 21 is explained. Inspection data was input for a total of 1992 wafers, and the inspection data of the 1992 wafers was clustered into a total of 42 clusters. One of them is a cluster of defect patterns in which a negative skewed distribution is severe and is given a score that may be understood as having a high degree of risk. In addition, the other 37 clusters are clusters in which two or more defect patterns are mixed and have a score that may be understood as having a medium degree of risk. Further, the remaining 4 clusters are clusters of wafers with a single defect pattern that is known to be of little concern and are given a score that may be understood to have a low degree of risk. A cluster with the largest number of wafers among 1992 wafers is an 'Edge' cluster with 40.2% wafers. In the 'Edge' cluster, it will be understood that automatic labeling was performed by referring to the inspection data on which labeling was completed. The 'Edge' cluster has a low degree of risk, so it is unlikely that user manipulation will occur. Nevertheless, when the user manipulation of the 'Edge' cluster is continuously generated, a description will be given with reference to FIG. 22 of how grading of the 'Edge' cluster is updated.

This will be described with reference to Table (a) of FIG. 22. Table (a) indicates that, using the Taguchi auto-cut concept, when a representative value of a cluster is ($\mu+\sigma$) or less, a GOOD grade is given to the cluster, when a representative value of a cluster is greater than ($\mu+\sigma$) and less than ($\mu+\sigma$), the cluster is given a NORMAL grade, and when a representative value of a cluster is ($\mu+\sigma$) or higher, the cluster is given a BAD grade. It is assumed that the 'Edge' cluster is a cluster with the GOOD grade.

In addition, Table (a) indicates that wafer inspection data belonging to a cluster with the GOOD grade is normal with a 90% probability, water inspection data belonging to a cluster with the NORMAL grade is normal with a probability of 6.7%, and water inspection data belonging to a cluster with the BAD grade is normal with a probability of 3.3%.

Further, Table (b) indicates that a user manipulation probability for the cluster with the GOOD grade, a user manipulation probability for the cluster with the NORMAL grade, and a user manipulation probability for the cluster with the BAD grade are initially set as 10%, 60%, and 90%, respectively, as a prior probability.

Table (c) is a combination of information in Table (a) and Table (b). When there is a user manipulation for the cluster with the GOOD grade, a region without the user manipulation is erased as shown in Table (d). Referring to Equation (e), for each grade, probability normalization is performed using a probability of a region that is not erased. As a result, as shown in Equation (e), a probability that the 'Edge' cluster is actually normal is updated from a prior probability of 90% to a posterior probability of 56.6%, a probability that the 'Edge' cluster is actually normal is updated from a pre-probability of 6.7% to a posterior probability of 26.4%, and a probability that the 'Edge' cluster is actually defective is updated from a prior probability of 3.3% to a posterior probability of 17.0%. The highest of three Bayesian Inverse Probabilities is still normal. Therefore, even if there is one user manipulation on the 'Edge' cluster, the grade on the 'Edge' cluster will still maintain the GOOD grade. However, when there is continuous user manipulation of the 'Edge' cluster, the grade for the 'Edge' cluster will be degraded to the NORMAL grade or the BAD grade.

Embodiments of the present inventive concept described so far with reference to FIGS. 3 to 22 may be embodied as computer readable codes on a computer readable medium. The computer-readable recording medium may be, for example, a removable recording medium (CD, DVD, Blu-ray disc, USB storage device, removable hard disk) or a fixed recording medium (ROM. RAM, computer equipped hard disk). The computer program recorded on the computer-readable recording medium may be transmitted to other computing device a network such as the Internet and installed in the other computing device, thereby being used in the other computing device.

Hereinafter, the configuration and operation of a data processing device according to another embodiment of the present inventive concept will be described with reference to FIG. 23. With regard to the operation of the data processing device according to the present embodiment, it is noted that even if there is no separate description in connection with the present embodiment, other embodiments of the present inventive concept described with reference to FIGS. 1 to 22 may be applied to the present embodiment.

Figure 23:
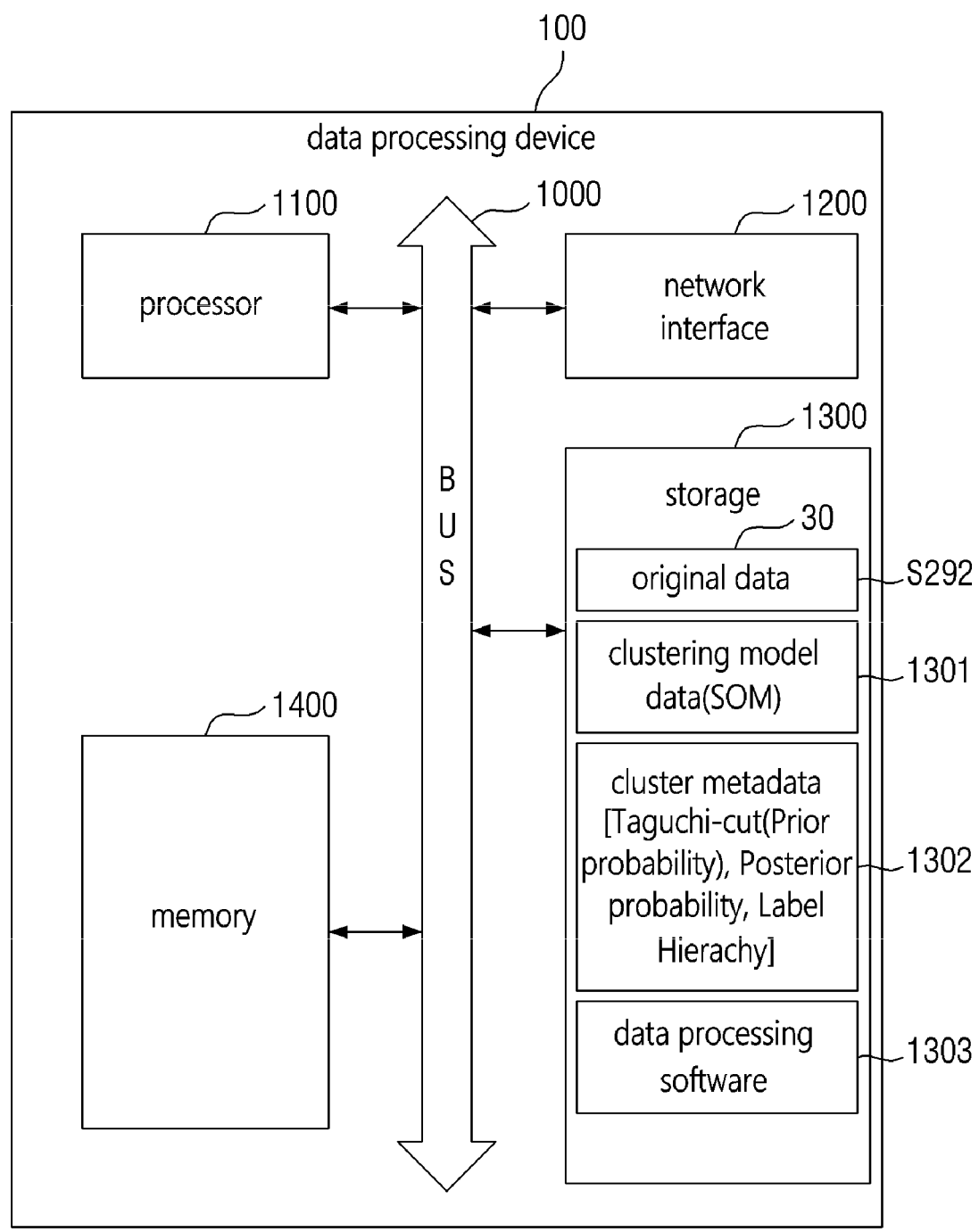
FIG. 23 is a hardware configuration diagram of an apparatus for processing data according to another embodiment of the present inventive concept.

As shown in FIG. 23, a data processing device 100 according to the present embodiment includes a processor 1100, a memory 1400, a network interface 1200, a storage 1300 and a processor 1100, a memory 1400, and a system bus 1000 that is a transmission/reception path of control signals and data between the network interface 1200 and the storage 1300.

In the data processing device 100 according to the present embodiment, an operating system (not shown) installed in the data processing device 100 loads data processing software 1303 into the memory 1400 and starts operations related to data clustering.

The data processing software 1303 performs noise filtering of be original data 30 stored in the storage 1300, performs the unsupervised learning of the clustering model to generate clustering model data 1301, and generates metadata 1302 for each cluster.

In summary again, the data processing software 1303 includes a plurality of instructions executed through the processor 1100, in which the plurality of instructions may include at least some of first to twelfth instructions below:

1st instruction: an instruction for obtaining original data including measurements (i.e., VALUEs) for a plurality of chips having coordinate values of a first axis and coordinate values of a second axis.

2nd instruction: an instruction for mapping the original data to a three-dimensional space composed of the first axis, the second axis, and a third axis, in which a coordinate value of the third axis is the VALUE.

3rd instruction: an instruction for performing first noise removal based on three-dimensional spatial auto-correlation on the original data mapped to the three-dimensional space.

4th instruction: an instruction for binarizing the VALUE based on a binarization reference value after the first noise removal is performed.

5th instruction: an instruction for performing second noise removal through density-based clustering on points remaining as a result of the binarization.

6th instruction: an instruction for obtaining a first feature based on a measurement distribution pattern obtained as a result of density estimation for the measurement after the first noise removal is performed.

7th instruction: an instruction for obtaining, after the binarization is performed, for points that indicate chips classified as defective on a plane composed of the first axis and the second axis, a second feature calculated based on a defective chip distribution pattern obtained as a result of polar coordinate system-based density estimation, and a third feature calculated based on a defective chip density for each quadrat formed on a plane on the wafer.

8th instruction: an instruction for performing unsupervised learning for generating a defect pattern clustering model using at least some of the first feature, the second feature, and the third feature.

9th instruction: an instruction for automatically performing cluster labeling on at least some of each cluster generated by the defect pattern clustering model depending on a result of comparison with wafer inspection data where cluster label information exists.

10th instruction: an instruction for adjusting at least one of notification priority and display priority for each cluster by reflecting user manipulation for each cluster.

11th instruction: an instruction for assigning, for each cluster generated by the defect pattern clustering model, a grade based on the measurement distribution pattern obtained as a result of density estimation for each chip-specific measurement of inspection data for each wafer clustered into the cluster.

12th instruction: an instruction for adjusting the grade for each cluster based on the Bayesian Update model, reflecting user manipulation related to each cluster and not matching the grade of the cluster.

In the above description, it is described that all the components constituting the embodiments of the present disclosure are combined or operated as one, but the technical features of the present disclosure are not limited to these embodiments. That is, within the scope of the present disclosure, all of the components may be selectively combined and operated in one or more combinations.

Although the operations are shown in a specific order in the drawings, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation. The scope of protection of the present invention should be interpreted by the following claims, and all technical ideas within the scope equivalent thereto should be construed as being included in the scope of the technical idea defined by the present disclosure.

What is claimed is:

1. A method for detecting a defect pattern on a wafer, the method being performed by a computing device, and comprising:
   obtaining binarized inspection data for each wafer including data indicating defectiveness of each of a plurality of chips, the binarized inspection data comprising a first axis coordinate based on a first axis, and a second axis coordinate based on a second axis;
   mapping the binarized inspection data to a three-dimensional space based on the first axis, the second axis, and a third axis, wherein third axis coordinates correspond to the data indicating defectiveness;
   generating a surface regression model through three-dimensional surface regression constructed by the binarized inspection data mapped to the three-dimensional space;
   performing first noise removal based on three-dimensional spatial auto-correlation on the binarized inspection data mapped to the three-dimensional space to generate denoised binarized inspection data, wherein the performing the first noise removal comprises using the surface regression model,
   extracting a feature from the denoised binarized inspection data, wherein the feature comprises a feature calculated based on a defective chip distribution pattern obtained as a result of density estimation based on a polar coordinate system of a defective chip; and
   performing unsupervised learning for generating a defect pattern clustering model using the feature of the denoised binarized inspection data.

2. The method of claim 1, wherein the feature comprises a first feature for a distribution pattern of a defective chip density for each radius from a center point of the wafer, and a second feature for a distribution pattern of a defective chip density for each circumferential angle of the wafer.

3. The method of claim 2, wherein the first feature is defined by a parameter of a first kernel density function (KDF) obtained as a result of kernel density estimation (KDE) for a number of defective chips for each radius, and a kernel function type, and
   wherein the second feature is defined by a parameter of a second kernel density function obtained as a result of kernel density estimation for a number of defective chips for each angle, and a kernel function type.

4. The method of claim 3, wherein the data indicating defectiveness are values of a smaller-the-better characteristic; and
   the first feature is calculated such that the first feature has a lower value as the defective chip distribution pattern is closer to a positive skewed distribution, and the first feature has a higher value as a measurement distribution pattern is closer to a negative skewed distribution.

5. The method of claim 1, further comprising:
   performing, after performing the first noise removal, a second noise removal through density-based spatial clustering of application with noise, on points where values of the data indicating defectiveness exist on a plane based on the first axis and the second axis.

6. The method of claim 5, wherein performing the second noise removal comprises:
   performing, after performing the first noise removal, a noise removal on points where the values of the data indicating defectiveness are less than a reference value; and
   performing the second noise removal through the density-based spatial clustering of application with noise on points remaining after the noise removal on the points where the values of data are less than the reference value is performed.

7. The method of claim 5, further comprising:
   repeating performing the first noise removal and performing the second noise removal on the binarized inspection data of each of wafers; and
   performing unsupervised learning for generating the defect pattern clustering model using the binarized inspection data on which the first noise removal and the second noise removal are completed.

* * * * *